United States Patent
Hong et al.

(10) Patent No.: US 12,550,375 B2
(45) Date of Patent: Feb. 10, 2026

(54) 3D-STACKED SEMICONDUCTOR DEVICE INCLUDING GATE STRUCTURE WITH RMG INNER SPACER PROTECTING LOWER WORK-FUNCTION METAL LAYER

(71) Applicant: SAMSUNG ELECTRONICS CO., LTD., Suwon-si (KR)

(72) Inventors: Byounghak Hong, Latham, NY (US); Gunho Jo, Clifton, NY (US); Seungchan Yun, Waterford, NY (US); Jaejik Baek, Watervliet, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 644 days.

(21) Appl. No.: 17/891,777

(22) Filed: Aug. 19, 2022

(65) Prior Publication Data
US 2023/0343845 A1    Oct. 26, 2023

Related U.S. Application Data

(60) Provisional application No. 63/334,975, filed on Apr. 26, 2022.

(51) Int. Cl.
*H10D 30/67* (2025.01)
*H10D 62/10* (2025.01)
(Continued)

(52) U.S. Cl.
CPC ..... *H10D 30/6735* (2025.01); *H10D 30/6757* (2025.01); *H10D 62/121* (2025.01);
(Continued)

(58) Field of Classification Search
CPC .......... H10D 30/6735; H10D 30/6757; H10D 62/121; H10D 64/258; H10D 84/0128;
(Continued)

(56) References Cited

U.S. PATENT DOCUMENTS 10,991,711 B2   4/2021  Reznicek et al.
11,177,258 B2   11/2021 Xie et al.
(Continued)

OTHER PUBLICATIONS

Communication dated Sep. 20, 2023, issued by the European Patent Office in counterpart European Application No. 23169179.1.
(Continued)

*Primary Examiner* — Thanh T Nguyen
(74) *Attorney, Agent, or Firm* — Myers Bigel, P.A.

(57) ABSTRACT

Provided is a multi-stack semiconductor device that includes: a lower field-effect transistor in which a lower channel structure is surrounded by a lower gate structure including a lower gate dielectric layer, a lower work-function metal layer and a lower gate metal pattern; and an upper field-effect transistor in which an upper channel structure is surrounded by an upper gate structure including an upper gate dielectric layer, an upper work-function metal layer and an upper gate metal pattern, wherein a channel width of the upper channel structure is smaller than a channel width of the lower channel structure, and wherein a replacement metal gate (RMG) inner spacer is formed between the lower work-function metal layer and the upper work-function metal layer at regions where the lower channel structure is not vertically overlapped by the upper channel structure.

20 Claims, 15 Drawing Sheets

(51) Int. Cl.
*H10D 64/23* (2025.01)
*H10D 84/01* (2025.01)
*H10D 84/03* (2025.01)
*H10D 84/83* (2025.01)

(52) U.S. Cl.
CPC ....... *H10D 64/258* (2025.01); *H10D 84/0128* (2025.01); *H10D 84/0135* (2025.01); *H10D 84/038* (2025.01); *H10D 84/83* (2025.01)

(58) Field of Classification Search
CPC .. H10D 84/0135; H10D 84/038; H10D 84/83; H10D 64/017; H10D 30/014; H10D 30/43; H10D 62/151; H10D 84/85; H10D 84/0177; H10D 84/0167; H10D 88/00; H10D 88/01; H10D 84/856; H10D 30/62; H10D 62/118; B82Y 10/00
See application file for complete search history.

(56) References Cited

U.S. PATENT DOCUMENTS

| | | |
|---|---|---|
| 2018/0040695 A1* | 2/2018 | Smith ................. H10D 62/122 |
| 2018/0308766 A1 | 10/2018 | Mochizuki et al. |
| 2019/0131396 A1* | 5/2019 | Zhang ................... B82Y 10/00 |
| 2019/0196830 A1 | 6/2019 | Lilak et al. |
| 2019/0304848 A1 | 10/2019 | Cheng et al. |
| 2020/0118891 A1 | 4/2020 | Cheng et al. |
| 2020/0203341 A1 | 6/2020 | Barraud et al. |
| 2020/0286788 A1 | 9/2020 | Xie et al. |
| 2020/0365464 A1 | 11/2020 | Sreenivasan et al. |
| 2020/0365469 A1* | 11/2020 | Yamashita .......... H01L 21/3086 |
| 2021/0242351 A1 | 8/2021 | Gardner et al. |
| 2021/0408285 A1 | 12/2021 | Hickey et al. |
| 2022/0109046 A1* | 4/2022 | Hong ................. H10D 84/0167 |

OTHER PUBLICATIONS

Huang et al., "3-D Self-aligned Stacked NMOS-on-PMOS Nanoribbon Transistors for Continued Moore's Law Scaling," 2020 IEEE International Electron Devices Meeting (IEDM), Total 4 pages, 2020, XP033886012.

* cited by examiner

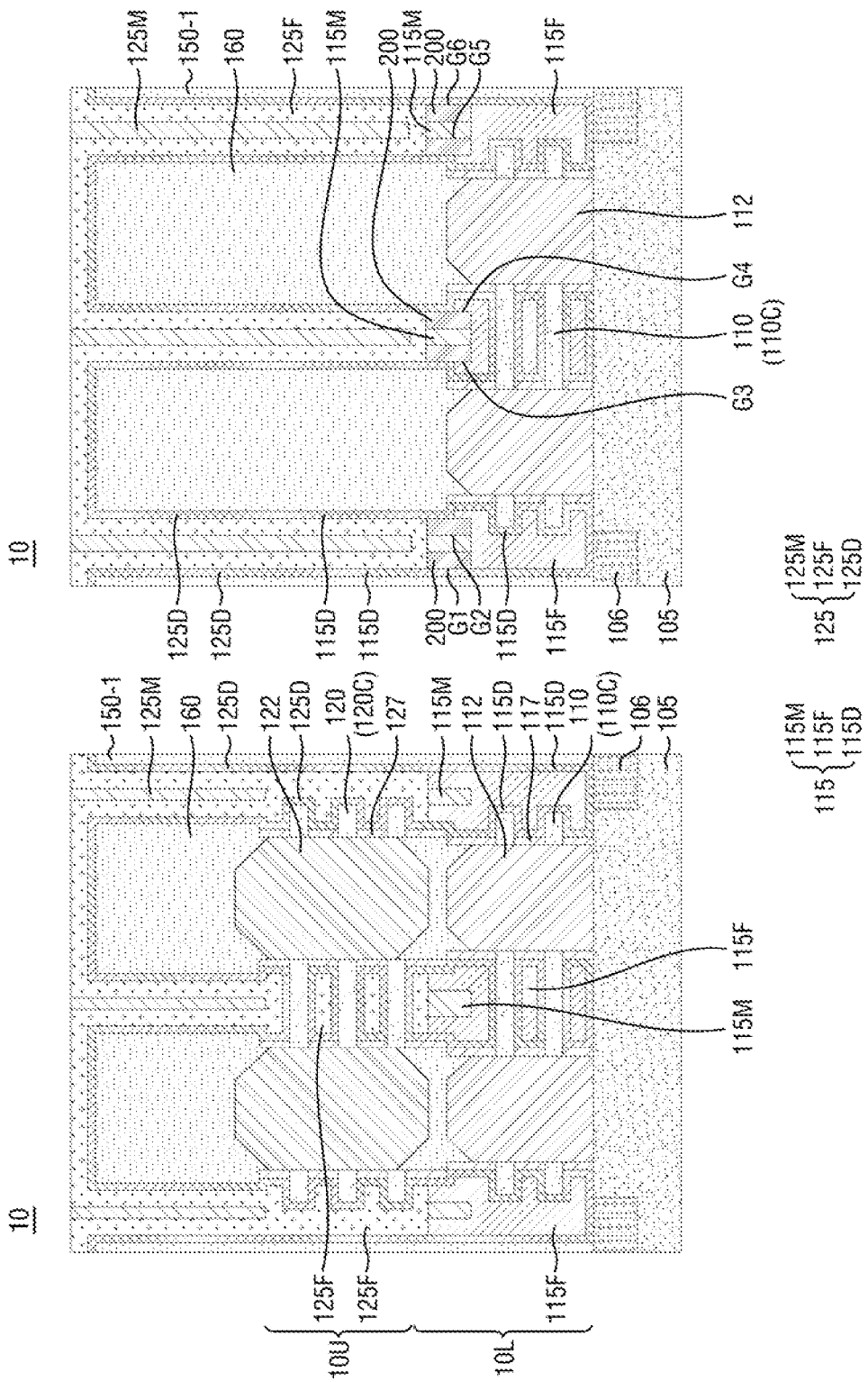

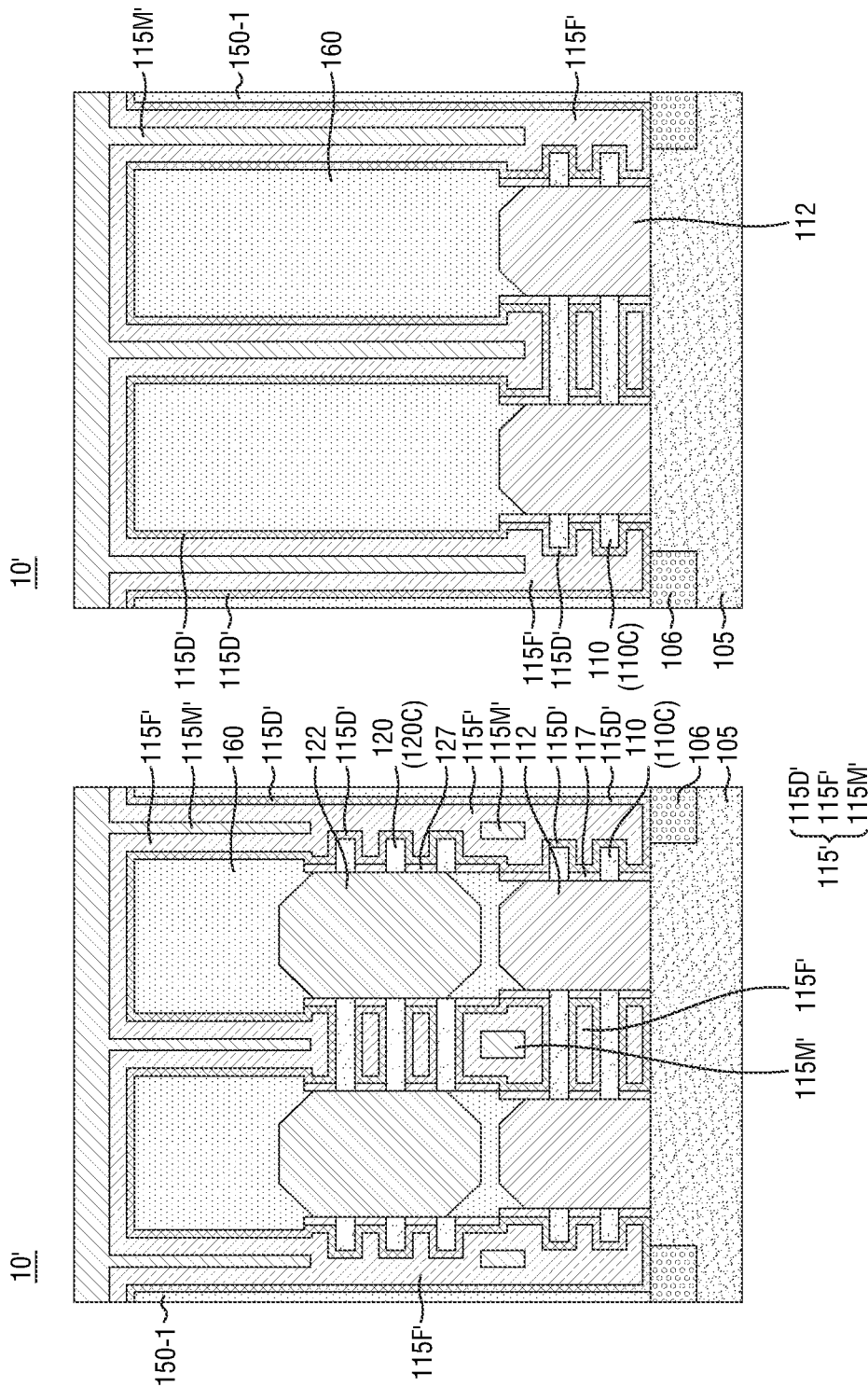

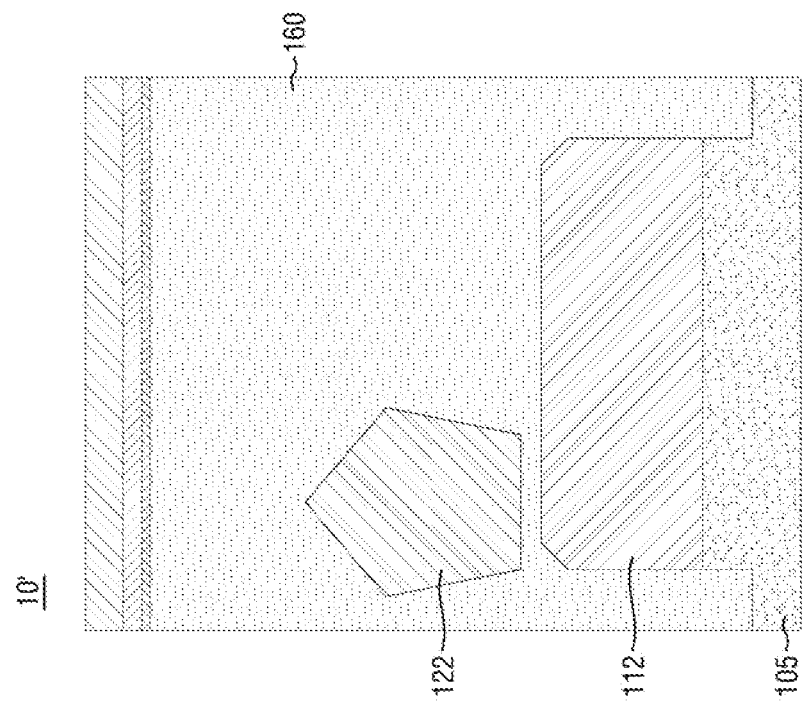
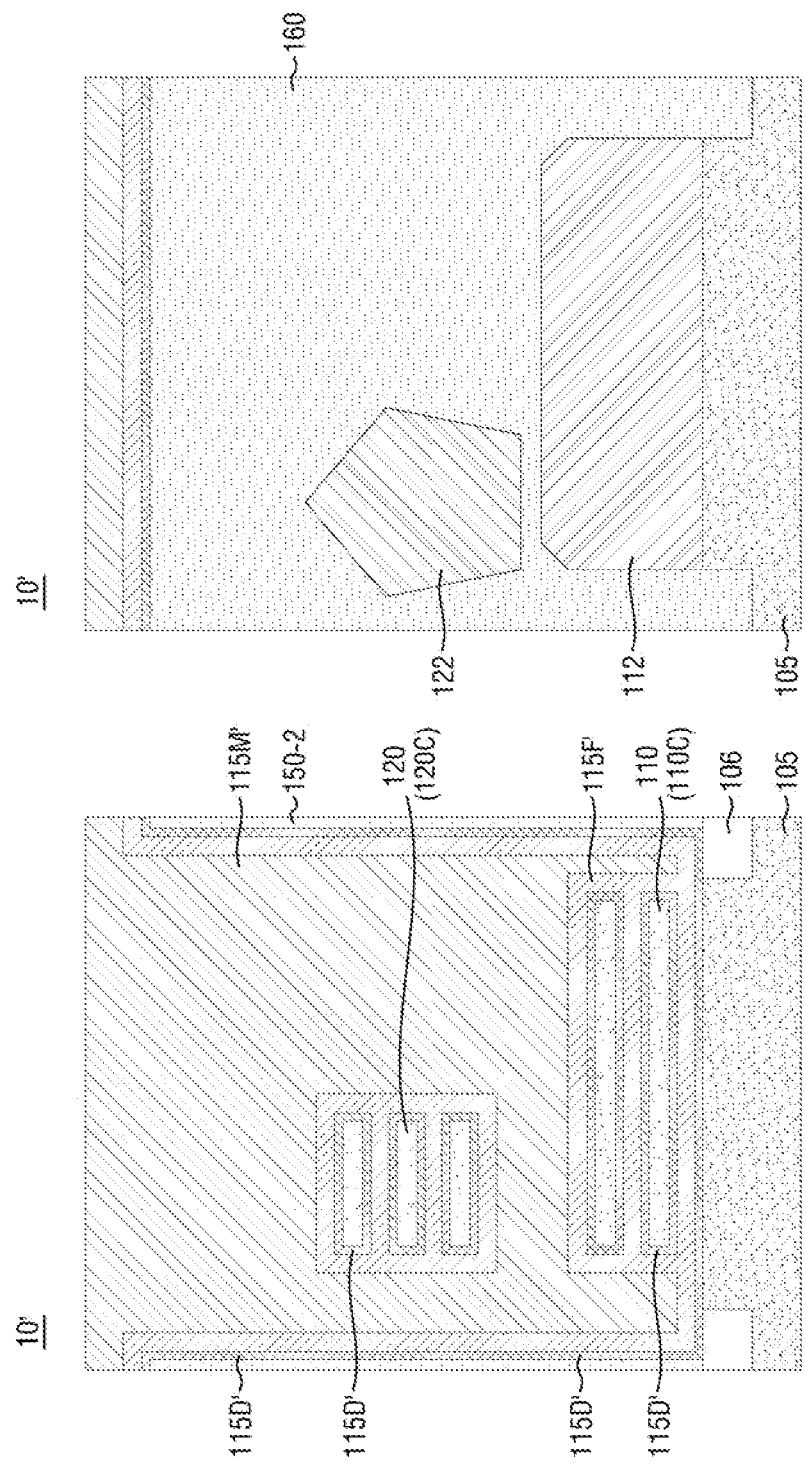

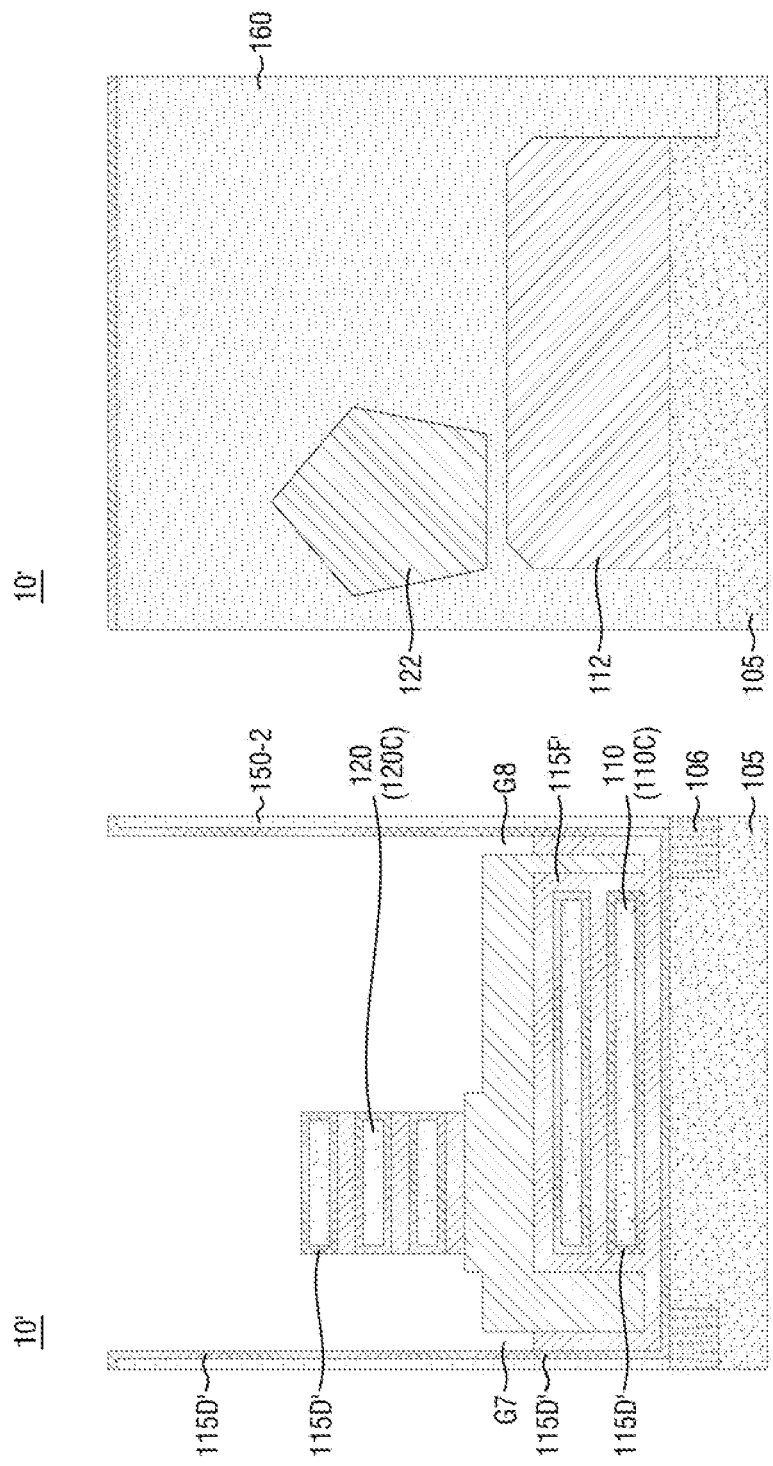

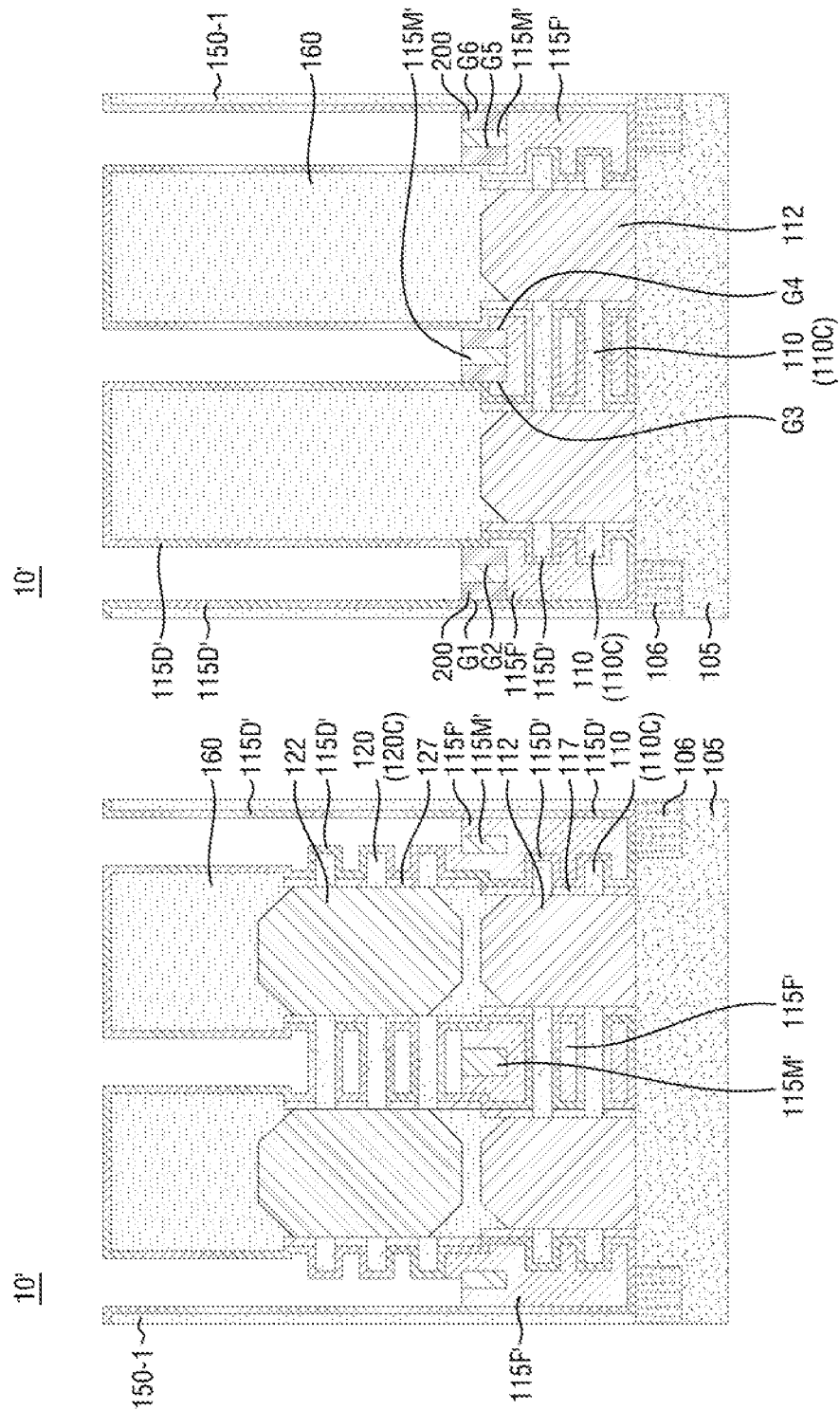

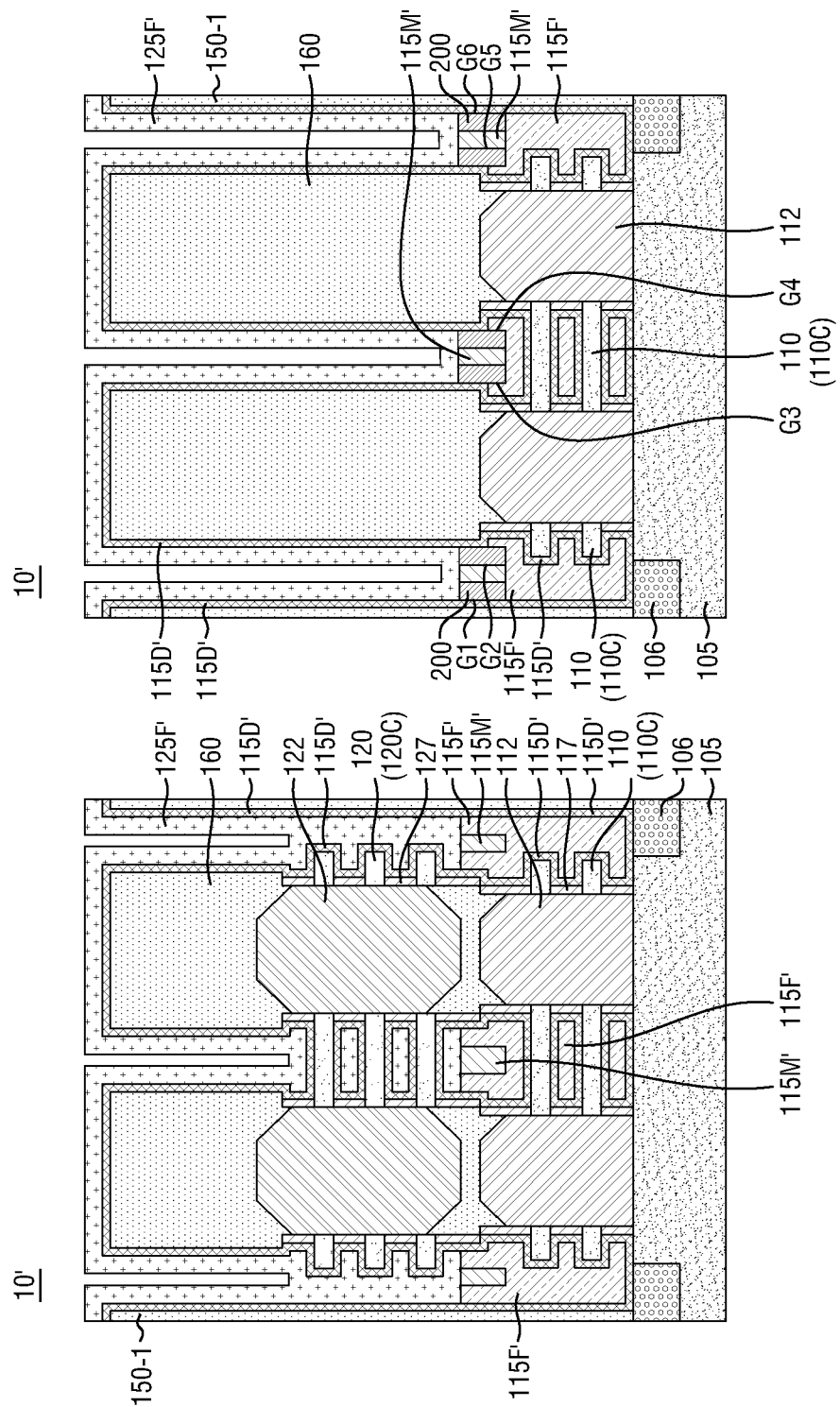

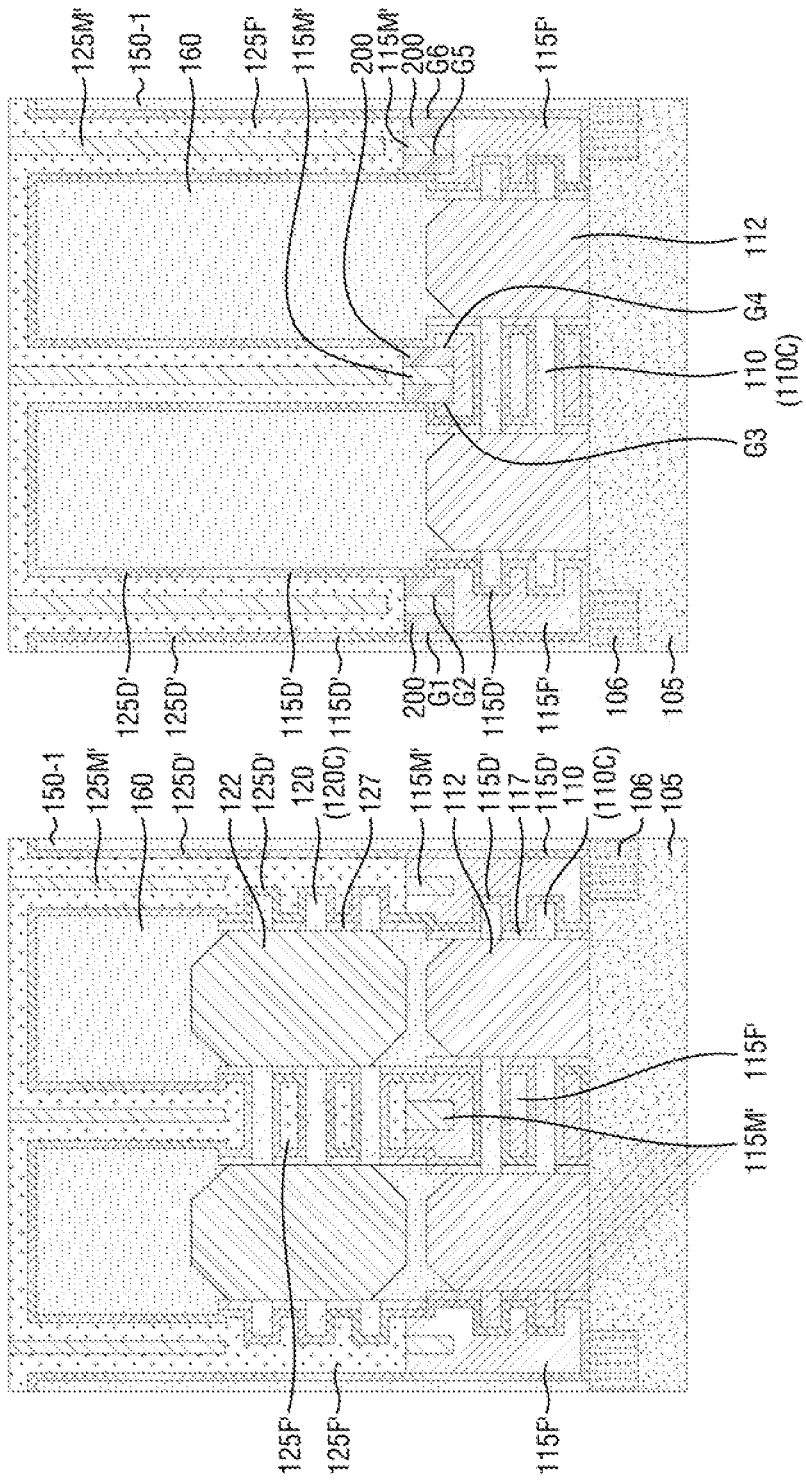

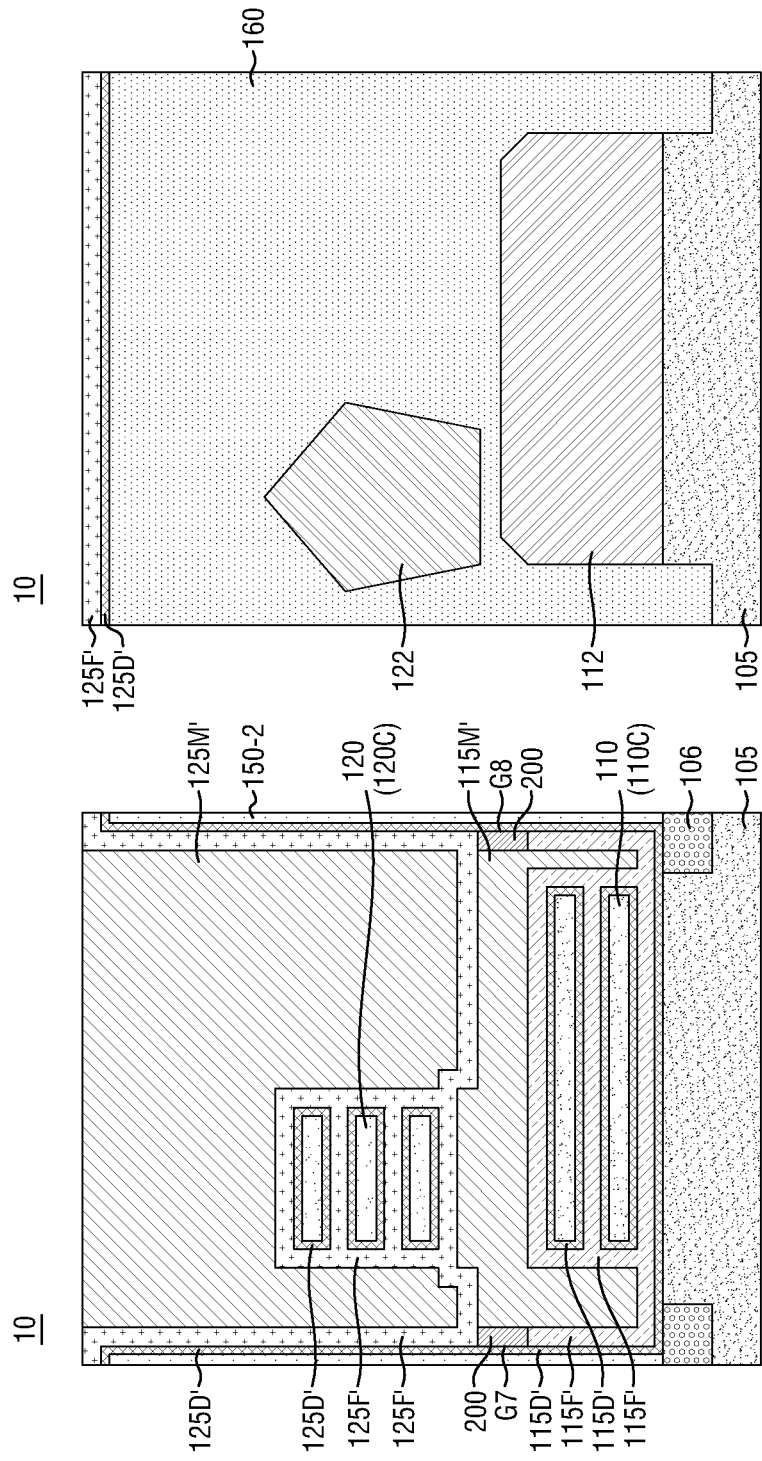

3D-STACKED SEMICONDUCTOR DEVICE INCLUDING GATE STRUCTURE WITH RMG INNER SPACER PROTECTING LOWER WORK-FUNCTION METAL LAYER

CROSS-REFERENCE TO RELATED APPLICATION

This application is based on and claims priority from U.S. Provisional Application No. 63/334,975 filed on Apr. 26, 2022 in the U.S. Patent and Trademark Office, the disclosure of which is incorporated herein in its entirety by reference.

BACKGROUND

1. Field

Apparatuses and methods according to embodiments relate to a multi-stack semiconductor device including a gate structure with a replacement metal gate (RMG) inner spacer that protects a lower work-function metal layer of the gate structure during formation of the multi-stack semiconductor device.

2. Description of the Related Art

Growing demand for integrated circuits having high device density has introduced a three-dimensional (3D) multi-stack semiconductor device in which two or more field-effect transistors such as nanosheet transistors are vertically stacked. The nanosheet transistor is characterized by multiple nanosheet channel layers vertically stacked on a substrate and a gate structure surrounding all surfaces of the nanosheet channel layers. Thus, the nanosheet transistor is referred to as gate-all-around (GAA) transistor, multi-bridge channel field-effect transistor (MBCFET).

The multi-stack semiconductor device including two vertically stacked nanosheet transistors may be manufactured by forming a lower nanosheet stack and an upper nanosheet stack thereon, enclosing the nanosheet stacks with a dummy gate structure, epitaxially growing source/drain regions on each nanosheet stack, and replacing the dummy gate structure with a gate structure including a gate dielectric layer, a work-function metal layer and a gate metal pattern, thereby forming a lower nanosheet transistor and an upper nanosheet transistor thereon. The gate structure may also be referred to as a replacement metal gate (RMG) structure because it replaces the dummy gate structure in the manufacturing of the semiconductor device.

When there is a requirement to differentiate the gate structure between the lower nanosheet transistor and the upper nanosheet transistor in the multi-stack semiconductor device, the work-function metal layer may be differently formed for lower and upper gate structures for the two transistors. For example, when the multi-stack semiconductor device is to form a complementary-metal-oxide transistor (CMOS) structure including opposite polarity field-effect transistors, that is, p-type and n-type field-effect transistors, lower and upper work-function metal layers of the gate structure may be formed to include different materials or material compounds to have different threshold voltages to drive the lower and upper gate structures differently for the lower and upper nanosheet transistors However, there is a challenge in forming two different work-function metal layers for the lower and upper nanosheet transistors in the multi-stack semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a multi-stack semiconductor device including a gate structure with an inner spacer protecting a lower work-function metal layer of the gate structure, and a method of manufacturing the same.

According to an embodiment, there is provided a multi-stack semiconductor device which may include: a substrate; a lower field-effect transistor in which a lower channel structure is surrounded by a lower gate structure including a lower gate dielectric layer, a lower work-function metal layer and a lower gate metal pattern; and an upper field-effect transistor in which an upper channel structure is surrounded by an upper gate structure including an upper gate dielectric layer, an upper work-function metal layer and an upper gate metal pattern, wherein a channel width of the upper channel structure is smaller than a channel width of the lower channel structure, and wherein an inner spacer is formed between the lower work-function metal layer and the upper work-function metal layer at regions where the lower channel structure is not vertically overlapped by the upper channel structure.

According to an embodiment, at least the lower field-effect transistor of the multi-stack semiconductor device may be a nanosheet transistor, and the lower channel structure may include a plurality of nanosheet layers vertically stacked on the substrate.

According to an embodiment, a top surface of the lower work-function metal layer on which the inner spacer is formed is lower than a level of a top surface of the lower gate metal pattern.

According to an embodiment, there is provided a multi-stack semiconductor device which may include: a substrate; a lower field-effect transistor in which a lower channel structure is surrounded by a lower gate structure including a lower gate dielectric layer, a lower work-function metal layer and a lower gate metal pattern; and an upper field-effect transistor in which an upper channel structure is surrounded by an upper gate structure including an upper gate dielectric layer, an upper work-function metal layer and an upper gate metal pattern, wherein an inner spacer is formed between the lower work-function metal layer and the upper work-function metal layer at a side of the lower gate metal pattern in a channel-width direction.

According to embodiments, there is provided a method of manufacturing a multi-stack semiconductor device. The method may include: (a) providing lower and upper channel structures, for respective lower and upper field-effect transistors, surrounded by a gate structure including a $1^{st}$ work-function metal layer and a $1^{st}$ gate metal pattern; (b) removing the $1^{st}$ gate metal pattern and the $1^{st}$ work-function metal layer, except the $1^{st}$ work-function metal layer formed between upper channel layers of the upper channel structure, down to a level between the lower and upper channel structures such that a plurality of grooves are formed at sides of the $1^{st}$ gate metal pattern on the $1^{st}$ work-function metal layer below the level, at selected regions; (c) forming an inner spacer in the plurality of grooves, and removing the $1^{st}$ work-function metal layer between the upper channel layers;

(d) forming a $2^{nd}$ work-function metal layer, comprising a material different from the $1^{st}$ work-function metal layer, on the upper channel structure and the $1^{st}$ gate metal pattern remaining below the level; and (e) forming a $2^{nd}$ gate metal pattern on the $2^{nd}$ work-function metal layer.

BRIEF DESCRIPTION OF DRAWINGS

Example embodiments of the inventive concept will be more clearly understood from the following detailed description taken in conjunction with the accompanying drawings in which:

FIGS. 1A-1E illustrate a multi-stack semiconductor device that includes a gate structure with an inner spacer protecting a lower work-function metal layer of the gate structure, according to an embodiment;

FIGS. 3A-3D to 7A-7D illustrate intermediate multi-stack semiconductor devices after respective steps of a method of manufacturing a multi-stack semiconductor device that includes a gate structure with an inner spacer protecting a lower work-function metal layer of the gate structure, according to embodiments.

DETAILED DESCRIPTION OF EXAMPLE EMBODIMENTS

Figure 1D:
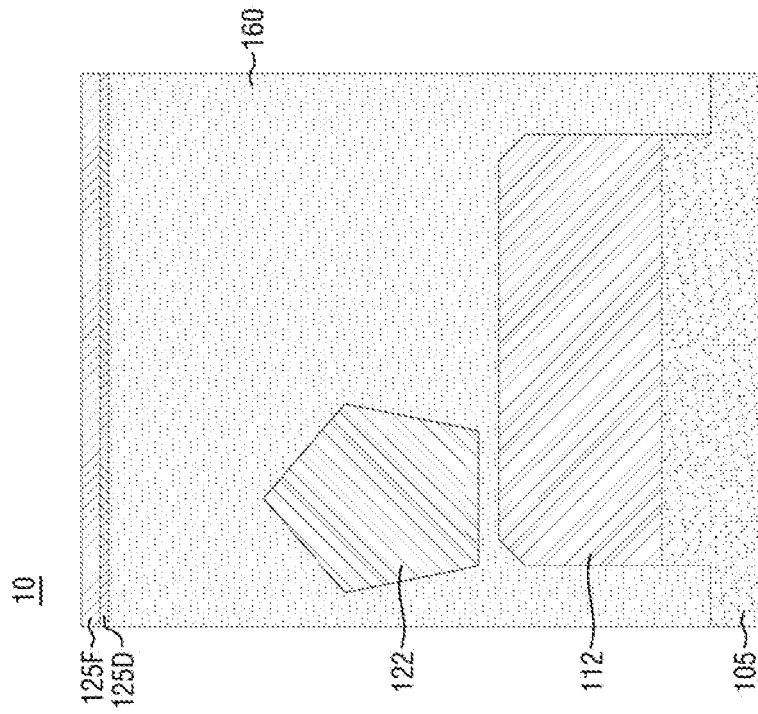

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of" when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor may or may not be described in detail herein. For example, a certain isolation layer or structure of a semiconductor device may be omitted herein when this layer or structure is not related to the various of aspects of the embodiments.

Herebelow, it is understood that the term "transistor" may refer to a semiconductor device including a gate structure and source/drain regions on a substrate, and the term "transistor structure" may refer to an intermediate semiconductor device structure before at least one of the gate structure and the source/drain regions is formed to complete the semiconductor device structure as a transistor.

FIGS. 1A-1E illustrate a multi-stack semiconductor device that includes a gate structure with an inner spacer protecting a lower work-function metal layer of the gate structure, according to an embodiment.

Figure 1C:
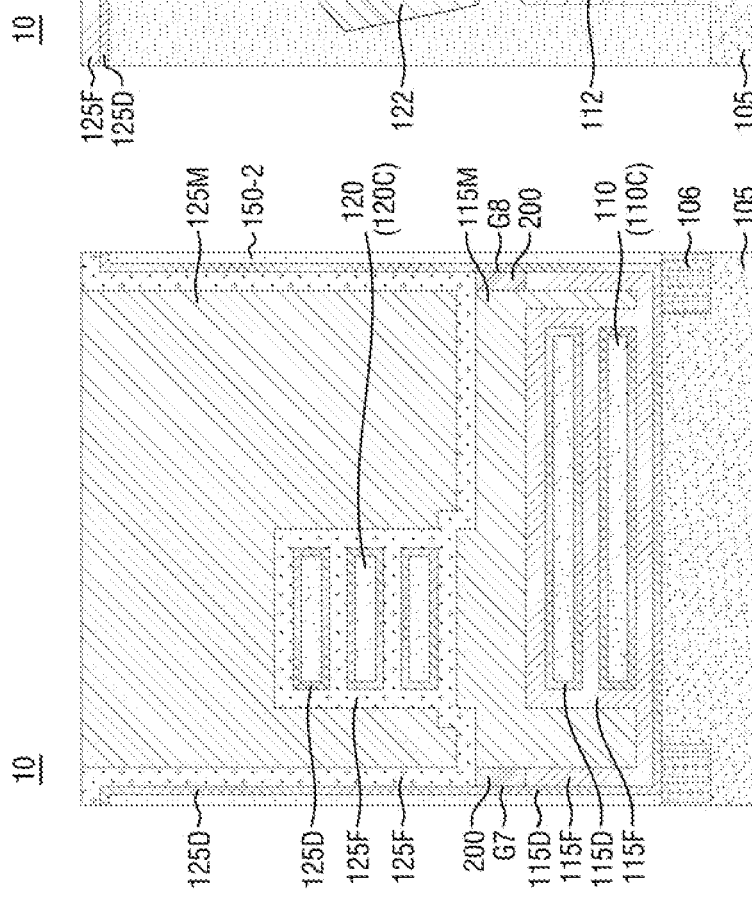
Figure 1E:
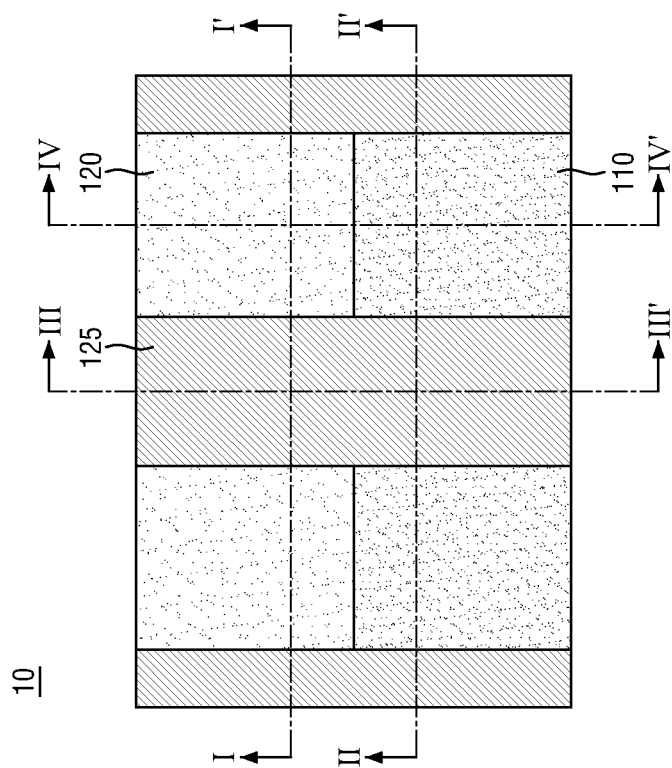

FIG. 1E is a top plan view of a multi-stack semiconductor device 10 which shows a channel structure and a gate structure enclosing the channel structure without showing a plurality of other structures or elements illustrated in FIGS. 1A-1D, for brevity purposes. FIGS. 1A-1D are cross-sectional views of the multi-stack semiconductor device 10 taken along lines I-I', and IV-IV' indicated in FIG. 1E, respectively.

It is understood herein that the lines I-I' and II-II' shown in FIG. 1E indicate a channel-length direction of the multi-stack semiconductor device 10, and the lines IV-IV' shown in FIG. 1E indicate a channel-width direction of the multi-stack semiconductor device 10. Thus, FIGS. 1A-1B show lengths of a channel structure and source/drain regions connected by the channel structures, and FIGS. 1C-1D show widths of the channel structure and the source/drain regions, in the multi-stack semiconductor device 10.

Referring to FIGS. 1A-1C, the multi-stack semiconductor device 10 may include a lower nanosheet transistor 10L and an upper nanosheet transistor 10U formed on a substrate 105. The substrate 105 may be a bulk substrate of a semiconductor material, for example, silicon, or a silicon-on-insulator (SOI) substrate. A shallow trench isolation (STI) structure 106 including silicon nitride or silicon oxide may be formed around the substrate 105 to isolate the multi-stack semiconductor device 10 from another multi-stack semiconductor device or circuit element in an integrated circuit including the multi-stack semiconductor device 10.

The lower nanosheet transistor 10L may include a plurality of lower channel layers 110C as a lower channel structure 110 of the multi-stack semiconductor device 10. The lower channel layers 110C may be nanosheet layers which are vertically stacked and horizontally parallel to each other above the substrate 105. The upper nanosheet transistor 10U may also include a plurality of upper channel layers 120C as an upper channel structure 120 of the multi-stack semiconductor device 10. Like the lower channel layers 110C, the upper channel layers 120C may also be nanosheet layers which are vertically stacked and horizontally parallel to each other above the lower channel layers 110C. The channel layers 110C and 120C may include a semiconductor material(s) such as silicon that may be epitaxially grown from the substrate 105.

Referring to FIGS. 1A, 1B and 1C, lower source/drain regions 112 may be formed on both ends of the lower channel structure 110 including the lower channel layers 110C in the channel-length direction. The lower source/drain regions 112 may also be epitaxial structures grown from the lower channel layers 110C and/or the substrate 105, and thus, may include the same or similar material(s) of the lower channel layers 110C and the substrate 105. Each of the lower channel layers 110C, at both ends thereof, may be connected to the lower source/drain regions 112. Similarly, upper source/drain regions 122 may be formed on both ends of the upper channel structure including the upper channel layers 120C in the channel-length direction. The upper source/drain regions 122 may be epitaxial structures grown from the upper channel layers 120C, and thus, may include the same or similar material(s) of the lower channel layers 110C. Each of the upper channel layers 120C, at both ends thereof, may be connected to the upper source/drain regions 122.

The lower source/drain regions 112 and the upper source/drain regions 122 may be doped with p-type or n-type dopants, depending on the type of field-effect transistor to be formed by the lower or upper source/drain regions 112 and 122. For example, the lower source/drain regions 112 may be doped with or implanted by n-type dopants such as arsenic or phosphorous to form the lower nanosheet transistor 10L as an n-type field-effect transistor, and the upper source/drain regions 122 may be doped with or implanted by p-type dopants such as boron to form the upper nanosheet transistor 10U as a p-type field-effect transistor. However, the embodiments are not limited thereto. The lower source/drain regions 112 may include the p-type dopants while the upper source/drain regions 122 include the n-type dopants. Further, the lower and upper source/drain regions 112 and 122 may all include the p-type dopants or the n-type dopants.

As shown in FIG. 1A, an interlayer dielectric (ILD) structure 160 may be formed above the upper source/drain regions 122 and between the upper source/drain regions 122 and the lower source/drain regions 112 at a region where the lower channel structure 110 and the lower source/drain regions 112 are vertically overlapped by the upper channel structure 120 and the upper source/drain regions 122, respectively (hereafter "overlapping region"). As shown in FIG. 1B, the overlapping region includes the cross-section of the multi-stack semiconductor device (FIG. 1A) along the lines I-I' shown in FIG. 1E. The ILD structure 160 may also be formed above the lower source/drain regions 112 at a region where the lower channel structure 110 and the lower source/drain regions 112 are not vertically overlapped by the upper channel structure 120 and the upper source/drain regions 122, respectively (hereafter "non-overlapping region"). The non-overlapping region includes the cross-section of the multi-stack semiconductor device (FIG. 1B) along the lines II-II' shown in FIG. 1E. The ILD structure may isolate the lower source/drain regions 112 from the upper source/drain regions 122, and may also isolate the lower and upper source/drain regions 112 and 122 from other circuit elements in the multi-stack semiconductor device 10.

FIG. 1D shows that the upper source/drain region 122 may have a smaller width than the lower source/drain region 112 in the channel-width direction. This is because the upper source/drain region 122 is grown from the upper channel structure 120 including the upper channel layers 120C having a smaller width than the lower channel structure 110 including the lower channel layers 110C, as shown in FIG. 1C. Due to this channel-width difference, a portion of the lower channel structure 110 may not be vertically overlapped by the upper channel structure 120 as shown in FIG. 1C.

The multi-stack semiconductor device 10 may have this channel-width difference to enable a lower source/drain region contact structure (not shown), which is extended down from a back-end-of-line (BEOL) structure (not shown) above the multi-stack semiconductor device, to land on a top surface of the lower source/drain region 112 shown in FIG. 1D. Otherwise, when the lower and upper channel structures 110 and 120 have an equal channel width, the lower and upper source/drain regions 112 and 122 may have an equal width, and then, the lower source/drain region contact structure may have to be bent and connected to a side surface of the lower source/drain region 112, the formation of which is more difficult and error prone.

In contrast, the upper channel structure 120 may have a greater number of channel layers than the lower channel structure 110. For example, the number of the upper channel layers 120C is three (3) while the number of the lower channel layers 110C is two (2), although these numbers are not limited thereto. Thus, while the channel width is differentiated for the above reason, the lower and upper nanosheet transistors 10L and 10U may have different numbers of channel layers so that the multi-stack semiconductor device may have an equal effective channel width (Well) in the lower and upper nanosheet transistors 10L and 10U.

While the lower source/drain regions 112 are connected to the lower channel structure 110, they may be isolated from the lower gate structure 115 by a lower inner spacer 117, as shown in FIG. 1A. Similarly, the upper source/drain regions 122 connected to the upper channel structure 120 may be isolated from the upper gate structure 125 by an upper inner spacer 127, as also shown in FIG. 1A. The lower and upper inner spacers 117 and 127 may be formed of one or more materials including silicon nitride, silicon oxide, silicon oxynitride, silicon oxycarbide, silicon boron carbonitride, silicon oxy carbonitride, etc. not being limited thereto.

Referring to FIGS. 1A-1C, the lower channel structure 110 including the lower channel layers 110C may be surrounded by a lower gate structure 115, which includes a lower gate dielectric layer 115D, a lower work-function metal layer 115F formed on the lower gate dielectric layer 115D, and a lower gate metal pattern 115M formed on the lower work-function metal layer 115F. The upper channel structure 120 including the upper channel layers 120C may be surrounded by an upper gate structure 125 which includes an upper gate dielectric layer 125D, an upper work-function metal layer 125F formed on the upper gate dielectric layer 125D, and an upper gate metal pattern 125M formed on the upper work-function metal layer 125F.

The lower and upper gate dielectric layers 115D and 125D may each include an interfacial layer and a high-k layer. The interfacial layer may be provided to protect the channel layers 110C and 120C, facilitate growth of the high-k layer thereon, and provide a necessary characteristic interface with the channel layers 110C and 120C. The interfacial layer may be formed of silicon oxide, silicon oxynitride, not being limited thereto. The high-k layer may be provided to allow an increased gate capacitance without associated current leakage at the channel layers 110C and 120C. The high-κ layer may be formed of one or more materials of hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$) and lead scandium tantalum oxide (PbScTaO), not being limited thereto.

According to an embodiment, the lower and upper gate dielectric layers 115D and 125D may be formed at the same time in manufacturing the multi-stack semiconductor device 10, and thus, may be connected to each other at sides of the multi-stack semiconductor device 10 in the channel-length direction and in the channel-width direction to form one single gate dielectric layer, as shown in the right side of FIG. 1A and the left side of FIGS. 1B-1C.

The lower and upper work-function metal layers 115F and 125F controlling respective threshold voltages for the lower and upper gate structures 115 and 125 may each be formed of titanium, tantalum (Ta) or their compound such as TiN, TiAl, TiAlN, TaN, TiC, TaC, TiAlC, TaCN, TaSiN, not being limited thereto. However, when the lower and upper nanosheet transistors 10L and 10U are to form n-type and p-type field-effect transistors, respectively, the lower and upper work-function metal layers 115F and 125F may be formed of different materials or material compounds to control the lower and upper gate structures 115 and 125 to have different threshold voltages. For example, to form an n-type lower nanosheet transistor, a combination of TiN and TiC may be included in the lower work-function metal layer 115F, while TiN without TiC or without carbon may be included in the upper work-function metal layer 125F to form a p-type upper nanosheet transistor. However, the embodiments are not limited thereto. The lower work-function metal layer 115F may be for the p-type nanosheet transistor, while the upper work-function metal layer 125F may be for the n-type nanosheet transistor, or both of the lower and upper work-function metal layers 115F and 125F may be one of the n-type nanosheet transistor and the p-type nanosheet transistor.

The lower and upper gate metal patterns 115M and 125M may each include tungsten (W), ruthenium (Ru), molybdenum (Mo), cobalt (Co), aluminum (Al), copper (Cu) or their compound, not being limited thereto, to receive an input voltage for the multi-stack semiconductor device 10 or for an internal routing of the multi-stack semiconductor device 10 to an adjacent circuit in the integrated circuit including the multi-stack semiconductor device 10. According to an embodiment, the lower and upper gate metal patterns 115M and 125M may be connected to each other with the upper work-function metal layer 125F therebetween as shown in FIG. 1C.

Herebelow, the structural characteristics of the lower and upper gate structures 115 and 125 of the multi-stack semiconductor device 10 according to embodiments are described.

Referring to FIG. 1A, the lower gate dielectric layer 115D with the lower work-function metal layer 115F thereon surrounding the lower channel layers 110C may be connected to the upper gate dielectric layer 125D with the upper work-function metal layer 125F thereon surrounding the upper channel layers 120C at the overlapping region as defined above. At this region, the upper gate dielectric layer 125D with the upper work-function metal layer 125F thereon may be further extended upward along sidewalls of the ILD structure 160 on the upper source/drain regions 122 to a level of a top surface of the ILD structure 160, and may also be formed on the top surface of the ILD structure 160.

Referring to FIGS. 1A-1B, at both of the overlapping region and the non-overlapping region as defined above, the lower gate dielectric layer 115D may also be formed below the lower channel structure 110 with the lower work-function metal layer 115F thereon, on the substrate 105, and may be laterally extended out to a $1^{st}$ isolation structure 150-1 in the channel-length direction. The $1^{st}$ isolation structure 150-1 may be a diffusion break structure that isolates the lower and upper source/drain regions 112 and 122 from other source/drain regions in the integrated circuit including the multi-stack semiconductor device 10. The $1^{st}$ isolation structure 150-1 may include silicon oxide or silicon nitride, not being limited thereto. This laterally extended lower gate dielectric layer 115D with the lower work-function metal layer 115F thereon may be further extended upward on lower sidewalls of the $1^{st}$ isolation structure 150-1.

FIG. 1A further shows that, at the overlapping region, the lower gate dielectric layer 115D and the lower work-function metal layer 115F on the lower sidewalls of the $1^{st}$ isolation structure 150-1 may be respectively connected to the upper gate dielectric layer 125D and the upper work-function metal layer 125F, which are formed on upper sidewalls of the $1^{st}$ isolation structure 150-1, at a level of a top surface of the lower gate metal pattern 115M. At this region, the upper gate dielectric layer 125D and the upper work-function metal layer 125F on the upper sidewalls of the $1^{st}$ isolation structure 150-1 may be extended upward to a level of a top surface of the $1^{st}$ isolation structure 150-1, and may also be formed on the top surface of the $1^{st}$ isolation structure 150-1.

However, FIG. 1B shows that, at the non-overlapping region, on the sidewalls of the $1^{st}$ isolation structure 150-1, the lower gate dielectric layer 115D may be connected to the upper gate dielectric layer 125D, while the lower work-function metal layer 115F may not be connected to the upper work-function metal layer 125F. At this non-overlapping region, the upper gate dielectric layer 125D and the upper work-function metal layer 125F on the upper sidewalls of the $1^{st}$ isolation structure 150-1 may be extended upward to the level of the top surface of the $1^{st}$ isolation structure 150-1, and may also be formed on the top surface of the $1^{st}$ isolation structure 150-1.

FIG. 1B further shows that, at this non-overlapping region, the lower gate dielectric layer 115D surrounding the lower channel layers 110C may be connected to the upper gate dielectric layer 125D on the sidewalls of the ILD structure 160 formed on the lower source/drain regions 112, while the lower work-function metal layer 115F may not be connected to the upper work-function metal layer 125F. This is because, as will be described later, $1^{st}$ to $6^{th}$ grooves G1-G6, which may include a replacement metal gate (RMG) inner spacer 200 therein, may be formed on the lower work-function metal layer 115F below the level of the top surface of the lower gate metal pattern 115M at this non-overlapping region. A top surface of the RMG inner spacer 200 in the $1^{st}$ to $6^{th}$ grooves G1-G6 may be coplanar with the top surface of the lower gate metal pattern 115M. The $1^{st}$ to $6^{th}$ grooves G1-G6 with the RMG inner spacer 200 therein may be extended along the $1^{st}$ isolation structure 150-1 in the channel-width direction. At this region, the upper gate dielectric layer 125D and the upper work-function metal layer 125F on the sidewalls of the ILD structure 160 may be extended upward to the level of the top surface of the ILD structure 160, and may also be formed on the top surface of the ILD structure 160.

FIG. 1C shows that the lower gate dielectric layer 115D below the lower channel structure 110 with the lower work-function metal layer 115F thereon, on the substrate 105, may be laterally extended out to a $2^{nd}$ isolation structure 150-2 in the channel-width direction. The $2^{nd}$ isolation structure 150-2 may be a gate-cut isolation structure that isolates the lower and upper gate structures 115 and 125 from other gate structures in the channel width-direction. The $2^{nd}$ isolation structure 150-2 may include silicon oxide or silicon nitride, not being limited thereto. This laterally extended lower gate dielectric layer 115D with the lower work-function metal layer 115F thereon under the lower channel structure 110 on the substrate 105 may be further extended upward on lower sidewalls of the $2^{nd}$ isolation structure 150-2.

FIG. 1C further shows that, on the sidewalls of the $2^{nd}$ isolation structure 150-2, the lower gate dielectric layer 115D may be connected to the upper gate dielectric layer 125D, while the lower work-function metal layer 115F may not be connected to the upper work-function metal layer 125F. This is because $7^{th}$ and $8^{th}$ grooves G7-G8, which may also include the RMG inner spacer 200 therein, may be formed on the lower work-function metal layer 115F below the level of the top surface of the lower gate metal pattern 115M at this non-overlapping region. Like the RMG inner spacer 200 in the $1^{st}$ to $6^{th}$ grooves G1-G6, the RMG inner spacer 200 in the $7^{th}$ and $8^{th}$ grooves G7-G8 may have a top surface which may be coplanar with the top surface of the lower gate metal pattern 115M.

The $7^{th}$ and $8^{th}$ grooves may be respectively formed at two sides of the lower gate metal pattern 115M opposite to each other in the channel-width direction. The $7^{th}$ and $8^{th}$ grooves G7-G8 with the RMG inner spacer 200 therein may be extended along the $2^{nd}$ isolation structure 150-2 in the channel length direction. Among the $7^{th}$ and $8^{th}$ grooves G7-G8, the $8^{th}$ groove G8 may be connected to the $3^{rd}$ and the $4^{th}$ grooves G3-G4 extended in the channel-width direction, and thus, the RMG inner spacer 200 therein may also be connected to one another.

Here, the upper gate dielectric layer 125D and the upper work-function metal layer 125F on upper sidewalls of the $2^{nd}$ isolation structure 150-2 may be extended upward to a level of a top surface of the $2^{nd}$ isolation structure 150-2, and may also be formed on the top surface of the $2^{nd}$ isolation structure 150-2.

According to an embodiment, when the lower and upper channel structures 110 and 120 have an equal channel width, and thus, the non-overlapping region may not exist in the multi-stack semiconductor device 10, the $1^{st}$ to $6^{th}$ grooves G1-G6 may not be formed in the multi-stack semiconductor device 10 while the $7^{th}$ and $8^{th}$ grooves may still be formed at the same positions shown in FIG. 1C.

The RMG inner spacer 200 included in the $1^{st}$ to $8^{th}$ grooves G1-G8 may be used for protecting the lower work-function metal layer 115F in a step of forming the upper work-function metal layer 125F in the multi-stack semiconductor device 10 and remain therein, as will be further described in reference to FIGS. 3A-3D to 7A-7D. Similar to the lower and upper inner spacers 117 and 127, the RMG inner spacer 200 may be formed of one or more materials including silicon nitride, silicon oxide, silicon oxynitride, silicon oxycarbide, silicon boron carbonitride, silicon oxy carbonitride, etc. not being limited.

Referring to FIGS. 1A-1C, the lower gate metal patterns 115M may be patterned on the lower work-function metal layers 115F surrounding the lower gate dielectric layer 115D to form the lower gate structure 115 of the multi-stack semiconductor device 10. The lower gate metal pattern 115M may cover top and side surfaces of the lower work-function metal layer 115F as shown in FIG. 1C. Thus, as shown in FIG. 1C, the lower gate dielectric layer 115D below the lower channel structure 110 on the substrate 105 and the lower work-function metal layer 115F thereon may extended out to the $2^{nd}$ isolation structure 150-2 under the lower gate metal pattern 115M in the channel-width direction. However, the lower gate metal pattern 115M may not be formed below the lower channel structure 110 and between the lower channel layers 110C while the lower gate dielectric layer 115D and the lower work-function metal layer 115F thereon may be formed therein, at least because of space limitation.

FIG. 1C further shows that the lower gate dielectric layer 115D, the lower work-function metal layer 115F, and the RMG inner spacer 200 in each of the $7^{th}$ and $8^{th}$ grooves G7-G8 on the lower sidewalls of the $2^{nd}$ isolation structure 150-2 may be laterally interposed between the lower gate metal pattern 115M and the lower sidewalls of the $2^{nd}$ isolation structure 150-2.

Referring back to FIG. 1B, the lower gate metal pattern 115M may also be formed between the adjacent $1^{st}$ and $2^{nd}$ grooves with the RMG inner spacer 200 therein, between the adjacent $3^{rd}$ and $4^{th}$ grooves with the RMG inner spacer 200 therein, and between the adjacent $5^{th}$ and $6^{th}$ grooves with the RMG inner spacer 200 therein. This is because, as will be further described in reference to FIGS. 3A-3D to 7A-7D, the $1^{st}$ to $6^{th}$ grooves are formed at both sides of the lower gate metal pattern 115M at these positions above the lower work-function metal layer 115F at the non-overlapping region due to the etch rate difference between the lower work-function metal layer 115F and the lower gate metal pattern 115M.

Referring back to FIGS. 1A and 1C, the upper work-function metal layer 125F formed below the upper channel structure 120 may be laterally extended out to be connected to the upper work-function metal layer 125F on the upper sidewalls of the $1^{st}$ and $2^{nd}$ isolation structures 150-1 and 150-2. This laterally extended portion of the upper work-function metal layer 125F may separate the lower gate metal pattern 115M from the upper gate metal pattern 125M by being disposed therebetween at the non-overlapping region as shown in FIG. 1C. However, the laterally extended portion of the upper work-function metal layer 125F does not isolate the upper gate metal pattern 125M and the lower gate metal pattern 115M from each other, and thus, the upper gate structure 125 and the lower gate structure 115 may still share a same gate input signal to form the multi-stack semiconductor device 10 as a CMOS device.

The upper gate metal pattern 125M may not be formed between the upper channel layers 120C while the upper gate dielectric layer 125D and the upper work-function metal layer 125F thereon may be formed therein, at least because of space limitation.

Thus, according to the above embodiments, the multi-stack semiconductor device 10 shown in FIGS. 1A-1E may be formed of the lower and upper nanosheet transistors 10L and 10U, in which the RMG inner spacer 200 is formed between the lower and upper work-function metal layers 115F and 125F of the respective gate structures 115 and 124 at selected regions.

Herebelow, a method of manufacturing a multi-stack semiconductor device corresponding to the multi-stack semiconductor device 10 shown in FIGS. 1A-1E will be described, according to embodiments.

Figure 2:
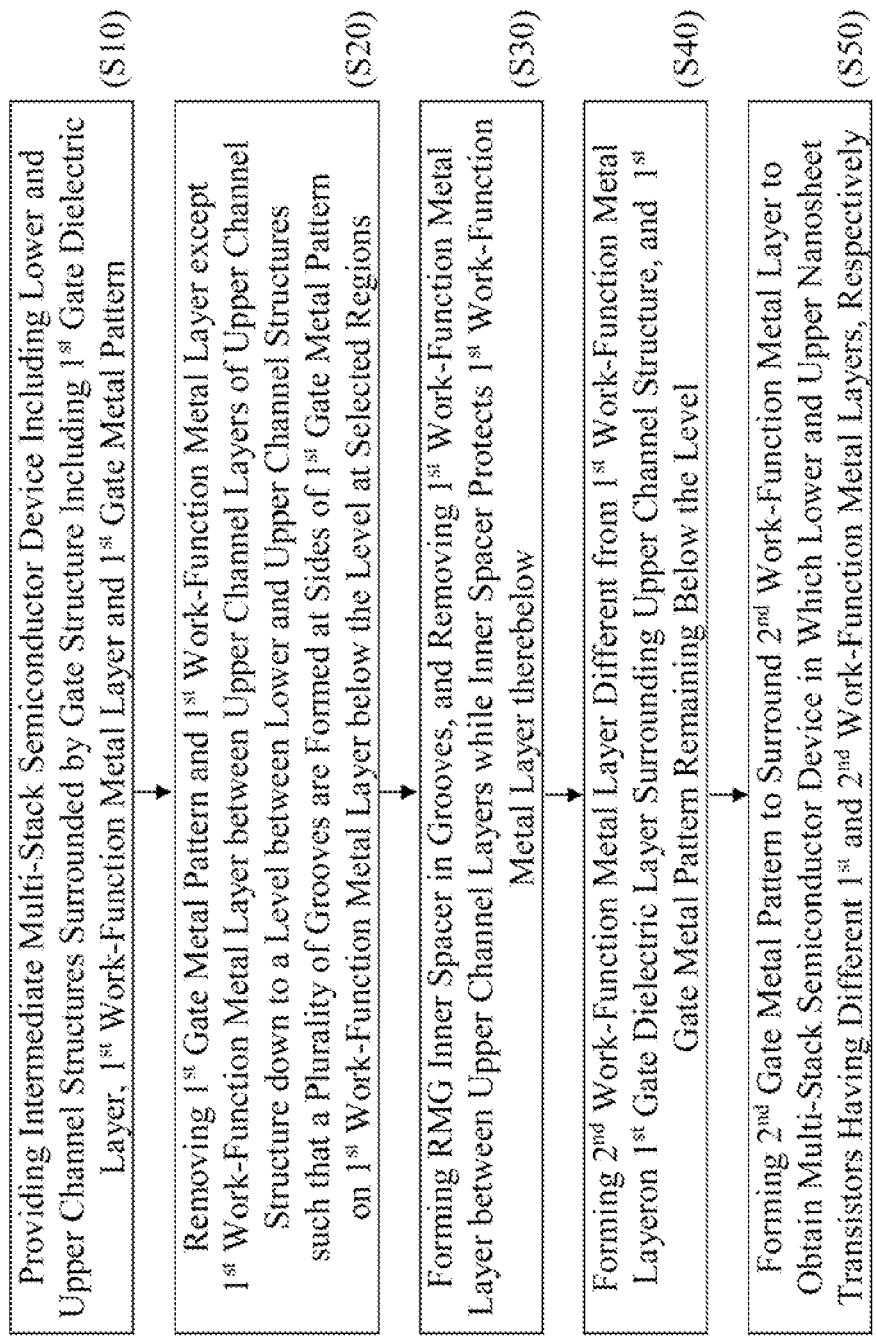
FIG. 2 illustrates a flowchart of a method of manufacturing a multi-stack semiconductor device that includes a gate structure with an inner spacer protecting a lower work-function metal layer of the gate structure, according to an embodiment.
Figures 4A, 4B:
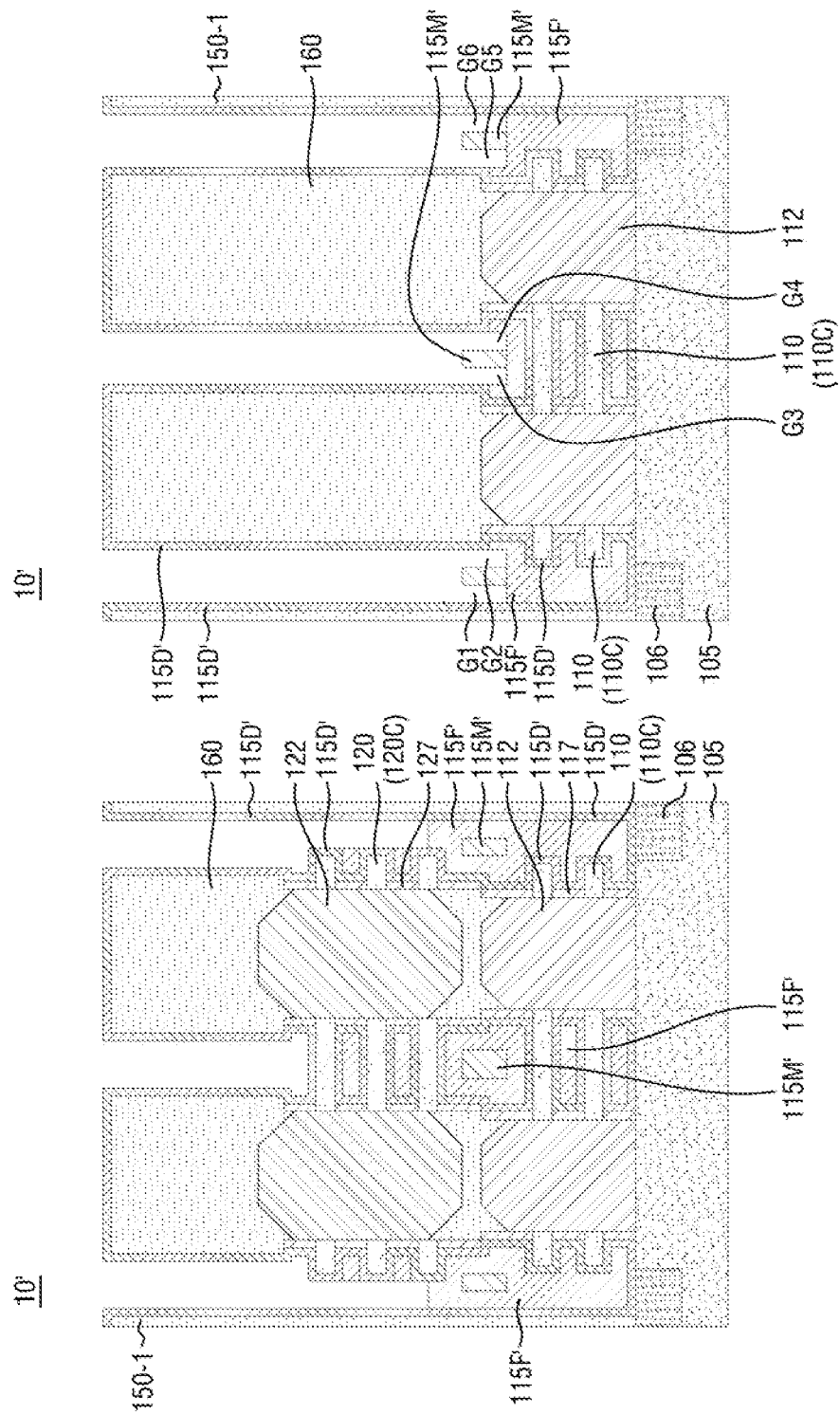
Figures 5C, 5D:
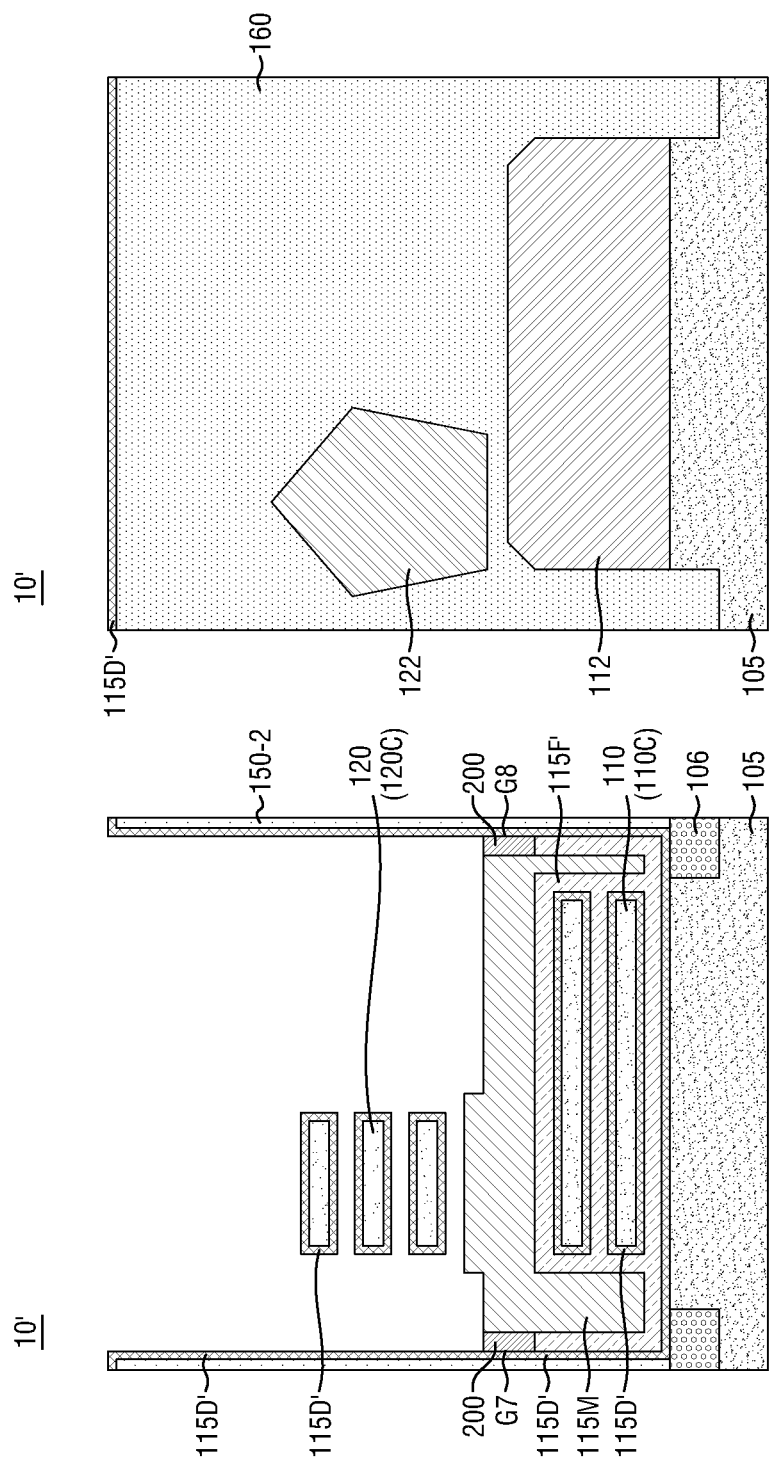
Figure 6D:
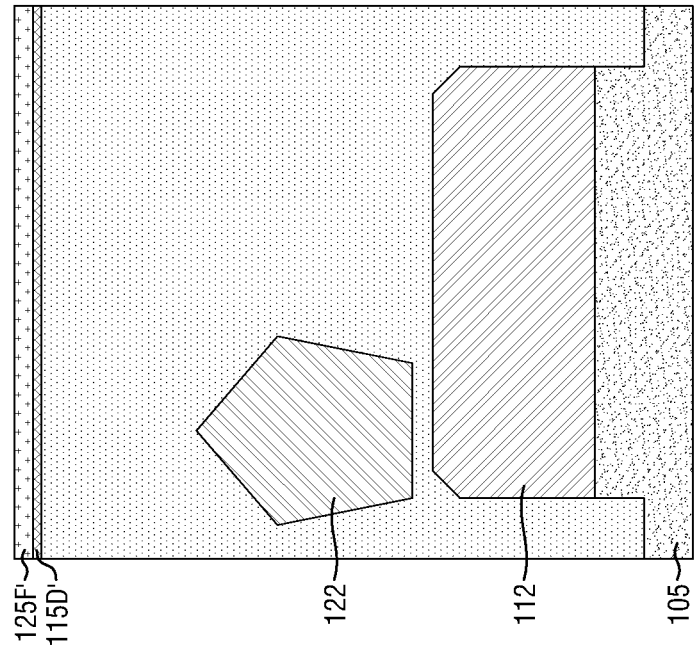
Figure 6C:
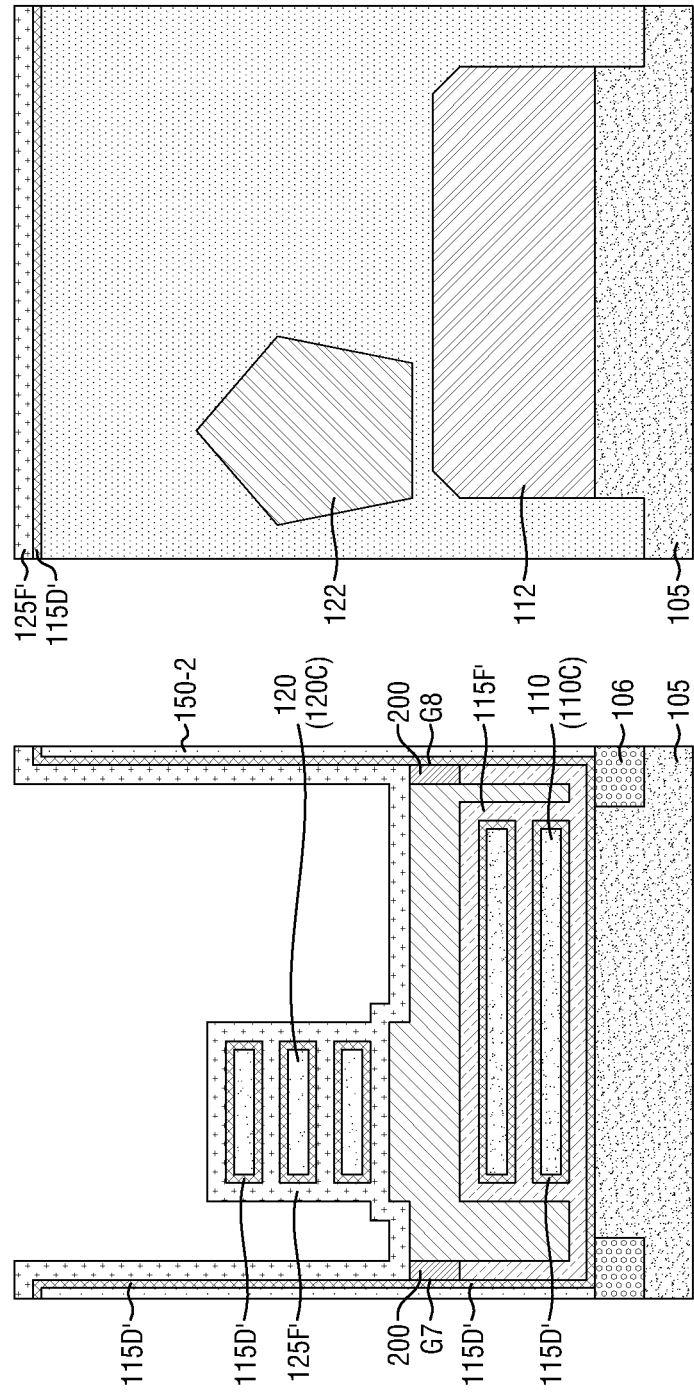

FIG. 2 illustrates a flowchart of a method of manufacturing a multi-stack semiconductor device that includes a gate structure with an inner spacer protecting a lower work-function metal layer of the gate structure, according to an embodiment. FIGS. 3A-3D to 7A-7D illustrate intermediate multi-stack semiconductor devices after respective steps of a method of manufacturing a multi-stack semiconductor device, according to embodiments.

The intermediate multi-stack semiconductor devices shown in FIGS. 3A-3D to 7A-7D may be the same as or correspond to the multi-stack semiconductor device 10 shown in FIGS. 1A-1E. Thus, descriptions about materials and functions of structures or elements included in the intermediate multi-stack semiconductor devices may be omitted herebelow when they are duplicate. The same reference numbers and reference characters used for describing the multi-stack semiconductor device 10 in FIGS. 1A-1E may be used herebelow when the same structures or elements are referred to.

In operation S10 (FIG. 2), an intermediate multi-stack semiconductor device is provided, which may include lower and upper channel structures, for lower and upper field-effect transistors, surrounded by a gate structure including a $1^{st}$ gate dielectric layer, a $1^{st}$ work-function metal layer and a $1^{st}$ gate metal pattern.

Referring to FIGS. 3A-3D, an intermediate multi-stack semiconductor device 10' including lower and upper channel structures 110 and 120 surrounded by a gate structure 115' may be provided on a substrate 105. Each of lower and upper channel structures 110 and 120 may be formed of a plurality of nanosheet layers as channel layers.

FIGS. 3C-3D show that, in the intermediate multi-stack semiconductor device 10', the upper channel structure 120 may have a smaller channel width than the lower channel structure 110. Accordingly, upper source/drain regions 122 grown from the upper channel structure 120 may have a smaller width than lower source/drain regions 112 grown from the lower channel structure 110. This channel-width difference and the source/drain region-width difference may be provided to facilitate connection of a source/drain contact structure on a top surface of the lower source/drain regions 112, as described above in reference to FIGS. 1A-1E.

FIGS. 3A-3C show that the gate structure 115' of the intermediate multi-stack semiconductor device 10' may include a 1st gate dielectric layer 115D', a $1^{st}$ work-function metal layer 115F' and a $1^{st}$ gate metal pattern 115M'. The $1^{st}$ gate dielectric layer 115D' with the $1^{st}$ work-function metal layer 115F' thereon may surround both lower and upper channel layers of the lower and upper channel structures 110 and 120. The $1^{st}$ gate metal pattern 115M' may be patterned to surround the $1^{st}$ work-function metal layer 115F'.

The $1^{st}$ gate dielectric layer 115D' and the $1^{st}$ work-function metal layer 115F' may be also formed below the lower channel structure 110 and laterally extended on the substrate 105 to $1^{st}$ and $2^{nd}$ isolation structures 150-1 and 150-2. The laterally extended $1^{st}$ gate dielectric layer 115D' and the $1^{st}$ work-function metal layer 115F' may also be extended upward along the sidewalls of the two isolation structures 150-1 and 150-2 to the level of a top surface thereof, and may also be formed thereon. The $1^{st}$ gate dielectric layer 115D' and the $1^{st}$ work-function metal layer 115F' may also be formed along sidewalls of an ILD structure 160 to the level of the top surface thereof, and may also be formed thereon.

In operation S20 (FIG. 2), the $1^{st}$ gate metal pattern and the $1^{st}$ work-function metal layer except the $1^{st}$ work-function metal layer formed between upper channel layers of the upper channel structure may be removed down to a level between the lower and upper channel structures such that a plurality of grooves are formed at sides of the $1^{st}$ gate metal pattern on the $1^{st}$ work-function metal layer below the level at selected regions.

Referring to FIGS. 4A-4D, the 1st gate metal pattern 115M' and the 1st work-function metal layer 115F' may be removed from the upper channel structure 120 down to a level between the lower and upper channel structures 110 and 120 except the 1st work-function metal layer 115F' formed between upper channel layers of the upper channel structure 120.

The removal operation in this step may be performed through, for example, photolithography and dry etching such as reactive ion etching (RIE) to selectively remove the 1st gate metal pattern 115M' and the 1st work-function metal layer 115F' to the level between the lower and upper channel structures 110 and 120 without affecting other semiconductor elements including the 1st gate dielectric layer 115D'. For example, fluorinated gas plasma mixed with oxygen may be used for an RIE etchant, not being limited thereto. Although not shown, the upper channel structure 120 with a mask pattern thereon may be used as a mask structure for the photolithography and dry etching operation. Thus, after the removal operation in this step, the 1st gate dielectric layer 115D' surrounding the upper channel structure 120 may remain in the intermediate multi-stack semiconductor device 10'. Due to the dry etching, the 1st work-function metal layer 115F' formed between upper channel layers of the upper channel structure 120 may also remain in the intermediate multi-stack semiconductor device 10'.

Moreover, when the reactive ion etching (RIE) having a higher etch rate for the material(s) forming the 1st work-function metal layer 115F' than for the material(s) forming the 1st gate metal pattern 115M' is applied in this step, the 1st work-function metal layer 115F' may be etched down further than the 1st gate metal pattern 115M'. As a result, a plurality of grooves including 1st to 8th grooves G1-G8 may be formed at sides of the 1st gate metal pattern 115M' remaining at or below the level between the lower and upper channel structures 110 and 120. The grooves may be formed on the remaining 1st work-function metal layer 115F' below a top surface of the remaining 1st gate metal pattern 115M', and thus, a bottom of the grooves may be a top surface of the remaining 1st work-function layer 115F' at that position. A height of the grooves may correspond to the etch rate difference between the material(s) of the 1st gate metal pattern 115M' and the material(s) of the 1st work-function metal layer 115F'. For example, the 1st gate metal pattern 115M' may include tungsten (W), ruthenium (Ru), molybdenum (Mo), cobalt (Co), aluminum (Al), copper (Cu) or their compound, and the 1st work-function metal layer 115F' may include titanium, tantalum (Ta) or their compound such as TiN, TiAl, TiAlN, TaN, TiC, TaC, TiAlC, TaCN, TaSiN, not being limited thereto.

Here, the 1st to 6th grooves G1-G6 may be formed on the 1st work-function metal layer 115F' remaining after the dry etching at the non-overlapping region as described above in reference to FIGS. 1A to 1E. Each of the 1st to 6th grooves G1-G6 may be extended in the channel-width direction with a portion of the 1st gate metal pattern 115M' which remains after the dry etching. This remaining portion of the 1st gate metal pattern 115M' may also be extended in the channel-width direction. Further, the 7th and 8th grooves which may be extended in the channel-length direction may be formed on the remaining 1st work-function metal layer 115F' between the remaining 1st gate metal pattern 115M' and the 2nd isolation structure 150-2.

Among the 1st to 8th grooves G1-G8, the 1st to 6th grooves G1-G6 may be formed due to the channel-width difference between the lower and upper channel structures 110 and 120 as discussed above. Thus, when the lower and upper channel structures 110 and 120 have an equal channel width, and thus, the intermediate multi-stack semiconductor device 10' does not have the non-overlapping region, the 1st to 6th grooves G1-G6 may not be formed by the photolithography and dry etching operation in this step, while the 7th and 8th grooves may still be formed at the same positions shown in FIG. 4C.

In operation S30 (FIG. 2), an RMG inner spacer may be formed in the grooves, and the 1st work-function metal layer between the upper channel layers may be removed while the inner spacer protects the 1st work-function metal layer therebelow.

Referring to FIGS. 5A to 5D, an RMG inner spacer 200 may be formed in the grooves including the 1st to 8th grooves G1-G8, and the 1st work-function metal layer 115F' remaining between upper channel layers 120C of the upper channel structure 120 after the dry etching in the previous step may be removed while the inner spacer 200 protects the 1st work-function metal layer 115F' therebelow.

The RMG inner spacer 200 may be formed in the grooves through, for example, a thin film deposition technique such as atomic layer deposition (ALD). The RMG inner spacer 200 may include one or more materials of silicon nitride, silicon oxide, silicon oxynitride, silicon oxycarbide, silicon boron carbonitride, silicon oxy carbonitride, etc. not being limited thereto. Although not shown in the drawings, the RMG inner spacer 200 may be formed by depositing the above inner spacer material(s) on the intermediate multi-stack semiconductor device 10' exposing the grooves through ALD, and pinching off the inner spacer material(s) formed in the grooves through, for example, wet etching using hydrofluoric acid (HF) or a mixture of hydrofluoric and nitric acid as wet etchant, not being limited thereto. This wet etching may selectively etch the material(s) forming the RMG inner spacer 200. Through this deposition and etching operation, the RMG inner spacer 200 may be pinched off to remain in the grooves. As the RMG inner spacer 200 is pinched off, a top surface of the RMG inner spacer 200 in the grooves may be coplanar with the top surface of the remaining 1st gate metal pattern 115M'.

While the RMG inner spacer 200 in the grooves formed in the non-overlapping region covers or protects the 1st work-function metal layer 115F' therebelow, the 1st work-function metal layer 115F' remaining between upper channel layers 120C of the upper channel structure 120 after the previous dry etching operation may be removed through, for example, wet etching using a wet etchant including hydrogen peroxide, not being limited thereto that may selectively attack the material(s), such as TiN or TiC, forming the 1st work-function metal layer 115F' against the material(s), such as tungsten (W), forming the 1st gate metal pattern 115M'.

Unless the grooves are formed and the RMG inner spacer 200 is formed therein, there may exist a risk of the wet etchant for removing the 1st work-function metal layer 115F' remaining between upper channel layers 120C may also attack the 1st work-function metal layer 115F' of the gate structure 115' surrounding the lower channel structure 110. In other words, by forming the grooves and the RMG inner spacer 200 therein, the 1st work-function metal layer 115F' of the gate structure 115' may be protected when the 1st work-function metal layer 115F' remaining between the upper channel layers 120C is removed in this step.

In operation S40 (FIG. 2), a 2nd work-function metal layer different from the 1st work-function metal layer may be formed on the 1st gate dielectric layer surrounding the upper channel structure and the 1st gate metal pattern remaining below the level.

Referring to FIGS. 6A-6D, a $2^{nd}$ work-function metal layer 125F' may be formed on the intermediate multi-stack semiconductor device 10' obtained in the previous step which exposes a top surface of the remaining $1^{st}$ gate metal pattern 115M', the upper channel structure 120 surrounded by the $1^{st}$ gate dielectric layer 115D', and the RMG inner spacer 200 filling the $1^{st}$ to $8^{th}$ grooves G1-G8.

The $2^{nd}$ work-function metal layer 125F' which may have a different material(s) or material compound from the $1^{st}$ work-function metal layer 115F' may be formed through, for example, atomic layer deposition (ALD), not being limited thereto. For example, the $2^{nd}$ work-function metal layer 125F' may include a combination of TiN and TiC to form an n-type gate structure, and the $1^{st}$ work-function metal layer 115F' may include TiN without TiC or without carbon to form a p-type gate structure, or vice versa.

The $2^{nd}$ work-function metal layer 125F' may be formed not only on the $1^{st}$ gate dielectric layer 115D' surrounding the upper channel layers 120C of the upper channel structure 120 but also on the remaining $1^{st}$ gate metal pattern 115M', the RMG inner spacer 200 in the $1^{st}$ to $8^{th}$ grooves G1-G8, the $1^{st}$ gate dielectric layer 115D' formed and exposed on the sidewalls and the top surfaces of the $1^{st}$ and $2^{nd}$ isolation structure 150-1, 150-2 and the ILD structure 160.

The $2^{nd}$ work-function metal layer 125F' formed on the remaining $1^{st}$ gate metal pattern 115M' may be laterally extended to be connected to the $2^{nd}$ work-function metal layer 125F' on the $1^{st}$ gate dielectric layer 115D' formed on the sidewalls of the $2^{nd}$ isolation structure 150-2.

In operation S50 (FIG. 2), a $2^{nd}$ gate metal pattern may be formed to surround the $2^{nd}$ work-function metal layer to obtain a multi-stack semiconductor device in which lower and upper nanosheet transistors have the different $1^{st}$ and $2^{nd}$ work-function metal layers, respectively.

Referring to FIGS. 7A-7D, a $2^{nd}$ gate metal pattern 125M' may be formed on the $2^{nd}$ work-function metal layer 125F' formed in the previous step, and planarized to finish an upper gate structure 125. The formation of the $2^{nd}$ gate metal pattern 125M' may be performed through, for example, physical vapor deposition (PVD), chemical vapor deposition (CVD), plasma enhanced chemical vapor deposition (PECVD), or combinations thereof, not being limited thereto. The planarization may be performed through, for example, a chemical mechanical planarization (CMP) technique, not being limited thereto, so that a top surface of the $2^{nd}$ gate metal pattern 125M' may be coplanar with the $2^{nd}$ work-function metal layer 125F' formed on the top surfaces of the $1^{st}$ and $2^{nd}$ isolation structure 150-1, 150-2 and the ILD structure 160.

The $2^{nd}$ gate metal pattern 125M' may be connected to the remaining $1^{st}$ gate metal pattern 115M' through the $2^{nd}$ work-function metal layer 125F' which is laterally extended to be connected to the $2^{nd}$ work-function metal layer 125F' on the $1^{st}$ gate dielectric 115D' on the sidewalls of the $2^{nd}$ isolation structure 150-2 in the previous step.

A lower portion of the gate structure 115' including the $1^{st}$ gate dielectric layer 115D' below the top surface of the remaining $1^{st}$ gate metal pattern 115M', the $1^{st}$ work-function metal layer 115F' and the remaining gate metal pattern 115M' may be or correspond to the lower gate structure 115 including the $1^{st}$ gate dielectric layer 115D, the $1^{st}$ work-function metal layer 115F and the remaining gate metal pattern 115M shown in FIGS. 1A-1D. An upper portion of the gate structure 125' including the $1^{st}$ gate dielectric layer 115D' above the top surface of the remaining $1^{st}$ gate metal pattern 115M', the $2^{nd}$ work-function metal layer 125F' and the $2^{nd}$ gate metal pattern 125M' may be or correspond to the upper gate structure 125 including the upper gate dielectric layer 125D, the upper work-function metal layer 125F and the upper gate metal pattern 125M. Thus, the intermediate multi-stack semiconductor device 10' shown in FIGS. 7A-7D may be or correspond to the multi-stack semiconductor device 10 shown in FIGS. 1A-1E.

The intermediate multi-stack semiconductor device 10' shown in FIGS. 7A-7D may still include the RMG inner spacer 200 in the grooves which is used to protect the $1^{st}$ work-function metal layer 115F' below the top surface of the $1^{st}$ gate metal pattern 115M' in the step of removing the $1^{st}$ work-function metal layer 115F' between the upper channel layers 120C surrounded by the $1^{st}$ gate dielectric layer 115D' as described above.

Thus far, the embodiments have been directed to a multi-stack semiconductor device formed of lower and upper nanosheet transistors. However, the present disclosure is not limited thereto, and may also apply to a multi-stack semiconductor device including fin field-effect transistors (FinFETs) as lower and upper transistors according to an embodiment. In this case, each of these FinFETs may have one or more vertically protruded fin structures as channel layers (channel structure) of which top and side surfaces are surrounded by a gate structure with an inner spacer protecting a lower work-function metal layer of a lower gate structure, according to an embodiment. Further, the upper FinFET may have a smaller channel width than the lower FinFET in this embodiment.

The present disclosure may further apply to a hybrid multi-stack semiconductor device including a nanosheet transistor and a FinFET as lower and upper transistors, respectively. In this case, the lower nanosheet transistor may be or correspond to the lower nanosheet transistor 10L of the multi-stack semiconductor device 10 described above, and a channel width of the FinFET may be smaller than the nanosheet transistor.

Figure 8:
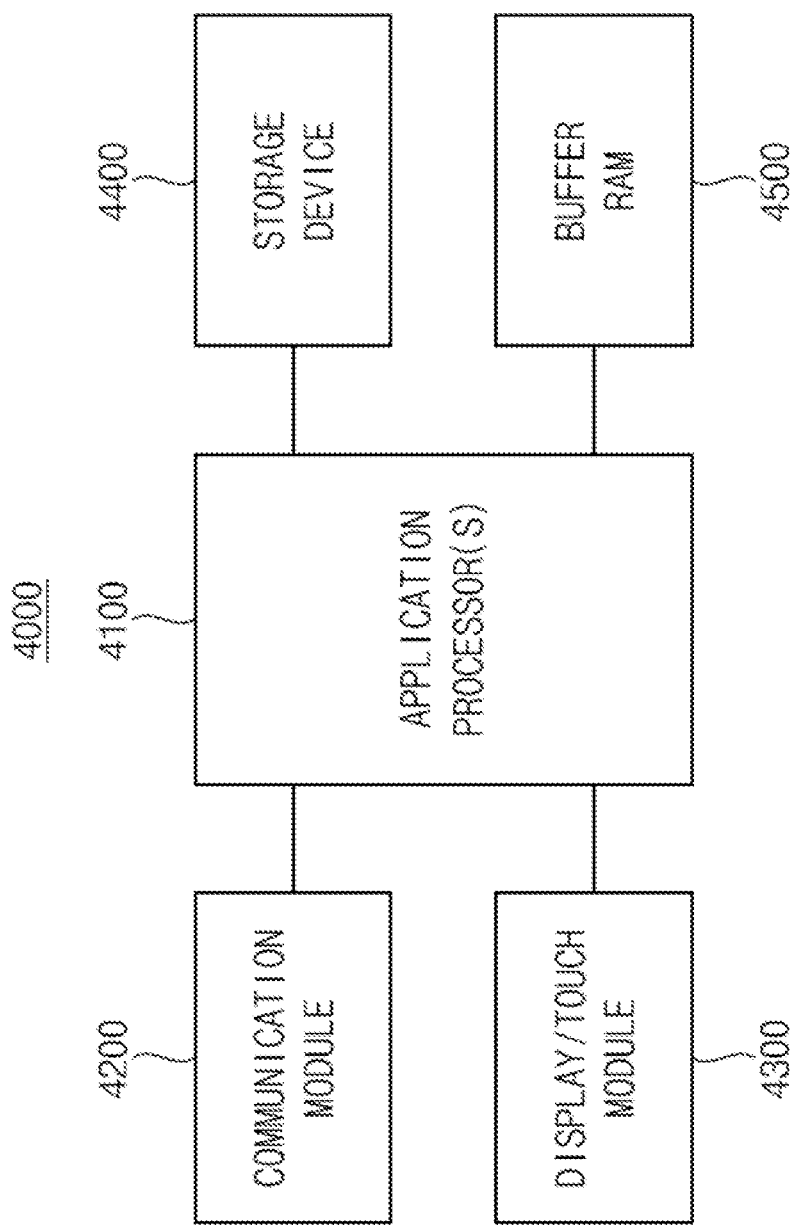
FIG. 8 is a schematic block diagram illustrating an electronic device including a multi-stack semiconductor device that includes a gate structure with an inner spacer protecting a lower work-function metal layer of the gate structure, according to an example embodiment.

FIG. 8 is a schematic block diagram illustrating an electronic device including a multi-stack semiconductor device that includes a gate structure with an inner spacer protecting a lower work-function metal layer of the gate structure, according to an example embodiment.

Referring to FIG. 13, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include the multi-stack semiconductor devices described above in reference to FIGS. 1A-1E to FIGS. 7A-7D.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A multi-stack semiconductor device comprising:
   a substrate;
   a lower field-effect transistor in which a lower channel structure is surrounded by a lower gate structure comprising a lower gate dielectric layer, a lower work-function metal layer and a lower gate metal pattern; and
   an upper field-effect transistor in which an upper channel structure is surrounded by an upper gate structure comprising an upper gate dielectric layer, an upper work-function metal layer and an upper gate metal pattern,
   wherein a channel width of the upper channel structure is smaller than a channel width of the lower channel structure, and
   wherein a replacement metal gate (RMG) inner spacer is formed between and contact a top surface of the lower work-function metal layer and a bottom surface of the upper work-function metal layer at selected regions where the lower channel structure is not vertically overlapped by the upper channel structure.

2. The multi-stack semiconductor device of claim 1, wherein the top surface of the lower work-function metal layer on which the RMG inner spacer is formed is lower than a level of a top surface of the lower gate metal pattern.

3. The multi-stack semiconductor device of claim 2, wherein a top surface of the RMG inner spacer is coplanar with the top surface of the lower gate metal pattern.

4. The multi-stack semiconductor device of claim 1, wherein the RMG inner spacer is formed in a plurality of grooves, and
   wherein a portion of the lower gate metal pattern is formed between two adjacent grooves among the plurality of grooves.

5. The multi-stack semiconductor device of claim 4, wherein the two adjacent grooves are extended in a channel-width direction.

6. The multi-stack semiconductor device of claim 4, wherein two grooves among the plurality of grooves are respectively formed at both sides of the lower gate metal pattern.

7. The multi-stack semiconductor device of claim 1, wherein a portion of the upper work-function metal layer is laterally extended above the lower channel structure where the lower channel structure is not overlapped by the upper channel structure.

8. The multi-stack semiconductor device of claim 7, wherein the RMG inner spacer is formed below a level of the laterally extended portion of the upper work-function metal layer.

9. The multi-stack semiconductor device of claim 8, wherein the laterally extended portion of the upper work-function metal layer is interposed between the lower gate metal pattern and the upper gate metal pattern.

10. The multi-stack semiconductor device of claim 1, wherein a diffusion break structure or a gate-cut isolation structure is formed at a side of the multi-stack semiconductor device, and a portion of the lower work-function metal layer and a portion of the upper work-function metal layer are formed along a sidewall of the diffusion break structure or the gate-cut isolation structure, and
    wherein the RMG inner spacer is formed between the portion of the lower work-function metal layer and the portion of the upper work-function metal layer along the sidewall.

11. The multi-stack semiconductor device of claim 1, wherein at least the lower field-effect transistor is a nanosheet transistor, and the lower channel structure comprises a plurality of nanosheet layers vertically stacked on the substrate.

12. The multi-stack semiconductor device of claim 11, wherein the RMG inner spacer contacts at least one of the lower gate dielectric layer and the upper gate dielectric layer along a channel-length direction.

13. The multi-stack semiconductor device of claim 1, wherein the RMG inner spacer contacts a side surface of a portion of the lower gate metal pattern along a channel-length direction.

14. The multi-stack semiconductor device of claim 13, wherein the RMG inner spacer is between a portion of the lower gate metal pattern and at least one of the lower gate dielectric layer and the upper gate dielectric layer along the channel-length direction.

15. A multi-stack semiconductor device comprising:
    a substrate;
    a lower field-effect transistor in which a lower channel structure is surrounded by a lower gate structure comprising a lower gate dielectric layer, a lower work-function metal layer and a lower gate metal pattern; and
    an upper field-effect transistor in which an upper channel structure is surrounded by an upper gate structure comprising an upper gate dielectric layer, an upper work-function metal layer and an upper gate metal pattern,
    wherein a replacement metal gate (RMG) inner spacer is formed between and contacts a top surface of the lower work-function metal layer and a bottom surface of the upper work-function metal layer at a side of the lower gate metal pattern in a channel-width direction.

16. The multi-stack semiconductor device of claim 15, wherein the top surface of the lower work-function metal layer on which the RMG inner spacer is formed is lower than a level of a top surface of the lower gate metal pattern.

17. The multi-stack semiconductor device of claim 16, wherein the RMG inner spacer contacts at least one of the lower gate dielectric layer and the upper gate dielectric layer along a channel-length direction.

18. The multi-stack semiconductor device of claim 17, wherein at least the lower field-effect transistor is a nanosheet transistor, and the lower channel structure comprises a plurality of nanosheet layers vertically stacked on the substrate.

19. The multi-stack semiconductor device of claim 15, wherein the RMG inner spacer is formed in a groove which is formed on the lower work-function metal layer at the side of the lower gate metal pattern in the channel-width direction, and extended in a channel-length direction.

20. The multi-stack semiconductor device of claim 15, wherein the RMG inner spacer contacts a side surface of a portion of the lower gate metal pattern along a channel-length direction.

* * * * *